(12) United States Patent
Pellon

(10) Patent No.: US 7,075,468 B1
(45) Date of Patent: Jul. 11, 2006

(54) WIDE-BANDWIDTH, LOW-LATENCY SIGMA-DELTA MODULATOR

(75) Inventor: Leopold E. Pellon, Hainesport, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 5 days.

(21) Appl. No.: 10/963,323

(22) Filed: Oct. 12, 2004

Related U.S. Application Data

(60) Provisional application No. 60/511,159, filed on Oct. 14, 2003.

(51) Int. Cl.
*H03M 3/00* (2006.01)

(52) U.S. Cl. ...................... 341/143; 341/144

(58) Field of Classification Search ............... 341/143, 341/144
See application file for complete search history.

(56) References Cited

U.S. PATENT DOCUMENTS 5,608,400 A * 3/1997 Pellon ......................... 341/143
5,673,044 A 9/1997 Pellon ......................... 341/143
6,271,781 B1 * 8/2001 Pellon ......................... 341/143

\* cited by examiner

*Primary Examiner*—Rexford Barnie
*Assistant Examiner*—Joseph Lauture
(74) *Attorney, Agent, or Firm*—Duane Morris LLP

(57) ABSTRACT

A Σ) analog-to-digital converter (ADC) includes an ADC converter element which receives resonated signals for generating output digital signals, and also a DAC for generating a reconstituted analog signal therefrom. A summer sums the reconstituted and input analog signals with filtered signals to generate resonated signals for the ADC element. A resonator includes a filter receiving the resonated signals, for producing the filtered signals for application to the summer. The summing circuit, the ADC element, and the digital-to-analog converter are in a first feedback loop, and the summer and the filter are in a second loop. The only coupling between the loops is the summing circuit. The delays of the loops become isolated from each other, and the overall performance of the sigma-delta ADC is dependent only on the longer of the two individual delays, rather than on the sum of the delays. This provides wider bandwidth A-D conversion (150).

8 Claims, 13 Drawing Sheets

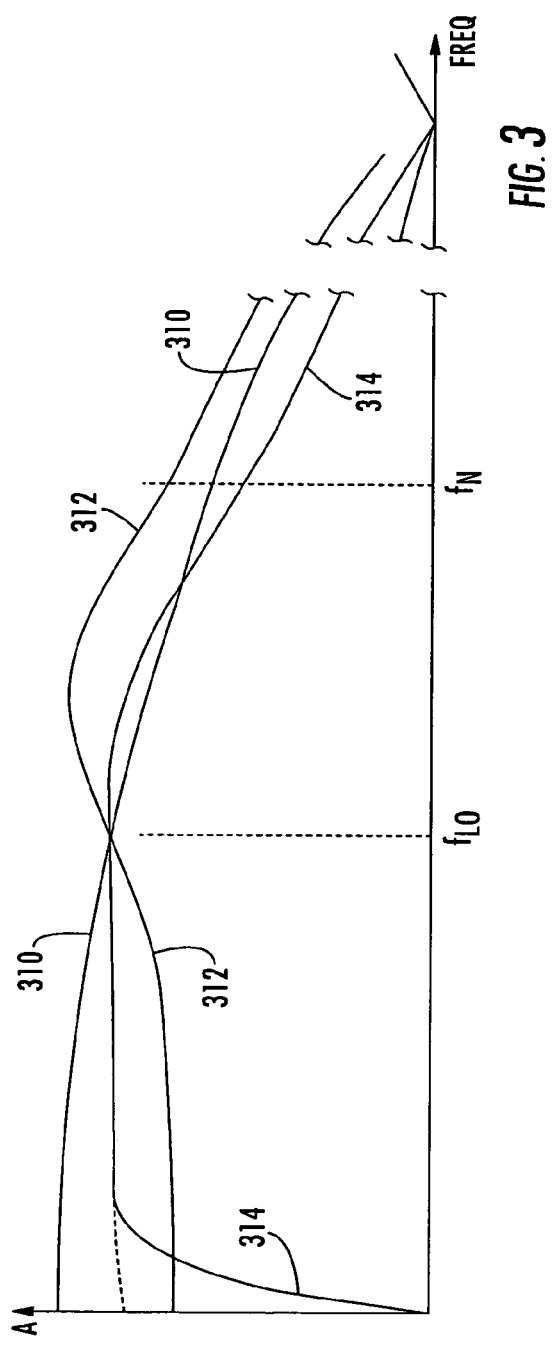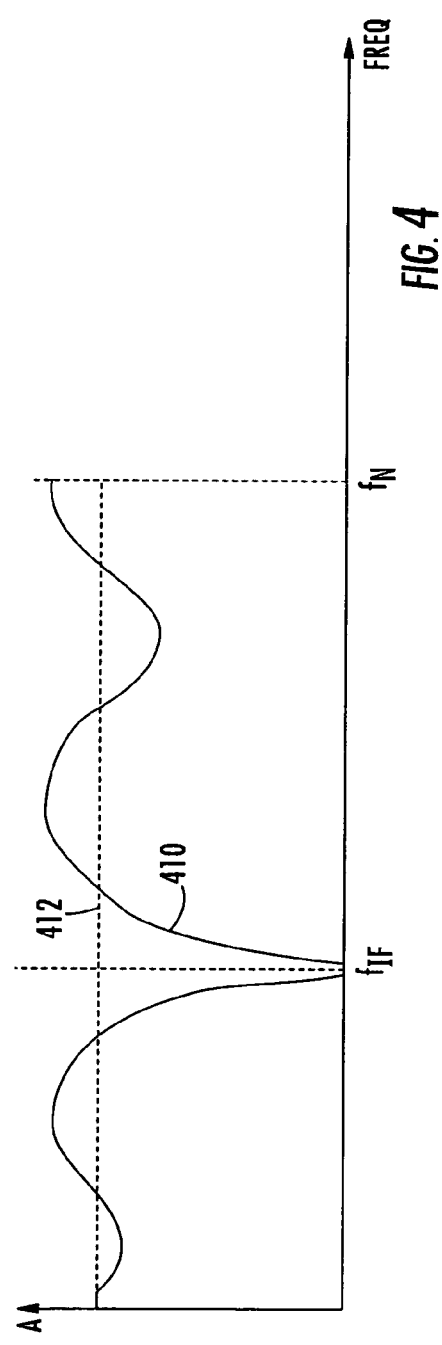

WIDE-BANDWIDTH, LOW-LATENCY SIGMA-DELTA MODULATOR

FIELD OF THE INVENTION

This application claims the benefit of U.S. Provisional patent application Ser. No. 60/511,159, filed Oct. 14, 2003 in the name of Pellon.

This invention relates to analog-to-digital converters (ADCs), and more particularly to ADCs of the over-sampled noise shaping type which employ a sigma-delta ($\Sigma$)) encoding feedback loop element, and a decoding digital signal processing element to obtain improved dynamic range over the widest possible pass band. In particular, the encoding feedback loop of greatest interest employs a continuous-time higher order loop filter, and a high speed low resolution analog-to-digital/digital-to-analog converter (ADC-DAC). In practice, the maximum usable bandwidth is limited by the latency of the feedback loop. This invention is for converters of this type with increased usable bandwidth by virtue of a reduced latency means of constructing higher order encoding feedback loops. An objective application includes digital receivers capable of capturing an entire operational band utilizing a low oversampling ratio with significantly improved spurious free dynamic range and signal to noise ratio over that of prior art.

BACKGROUND OF THE INVENTION

Many radio frequency sensor systems with digitally implemented signal processing functions require analog-to-digital converters (ADCs) for converting received bandpass signals into digital form. The quality of the performance of the digital system often depends upon the analog-to-digital converter's dynamic range, sampling jitter, and conversion rate, as a function of input signal frequency, where the output converted signal is sampled at a rate that is at least twice the bandwidth of the signal, according to the Nyquist criterion. The dynamic range is defined by the signal to noise and distortion ratio and the spurious free dynamic range, where the noise and distortion terms produced by the ADC corrupt the received signals and limit the ability to discern small signals from larger interference signals in the correlative and interference suppressing digital signal processing functions typically performed down-stream of the digital receiver. Examples include channelization filtering, digital beam forming, pulse Doppler filtering, and moving target detection. The processed residues are composed of receiver noise and spurious terms that are often dominated by that produced within the ADC element. An ideal digital receiver produces processed residues composed solely of thermal noise associated with the antenna characteristics and background radiation.

Some types of analog-to-digital converters employ multiple parallel decision circuits to resolve finely spaced levels. These circuits require well-matched input stages to achieve satisfactory signal to noise and distortion ratio. A typical approach for sampling and converting signals several hundreds of megahertz in bandwidth, or greater, employs this class of technique implemented with high speed mixed signal integrated circuit technology, where typically the transistors are capable of current gain at frequencies greater than 20 GHz, and can yield monolithic circuits with transistor count between 1000 and 20000. In this class of ADC, a feedforward multistage architecture is used where the first stage resolves the most significant bits and a second stage resolves a sampled analog difference signal produced by subtracting the digital-to-analog converted result of the first stage from a delayed sampled analog input. It is difficult to attain low noise decision circuits and sampling circuits with precise distribution and matching, and sampling aperture uncertainty to enable the desired signal to noise ratio and spurious free dynamic range levels. Increasing resolution in this type of ADC requires an exponentially increasing number of decision circuits and exponentially more stringent component and signal distribution matching requirements, that include small amplitude and delay skews. In general, to resolve N bits of amplitude of a given sample the aggregate linearity, noise, jitter and dynamic uncertainties must combine to a total error term that is $(2^{Nbit}-1)/\sqrt{12}$. Hence, resolving to a 16-b level for example, will require all errors to combine to 4.4 parts per million of the maximum output level minus the minimum output level.

Sigma-delta analog-to-digital converters achieve high resolution and low noise because the underlying technique utilizes a feedback loop to suppress the noise of a low resolution quantizer over a given pass band. Typically, suppression between 20 dB and 90 dB can be obtained with high order loop filters and with weights that spread the noise shaping zeroes over the pass band. As a result, a much smaller number of parallel decision circuits are required to attain high resolution, with relaxed matching requirements; however, these circuits must be capable of much greater bandwidth than that of the signal. To achieve high signal-to-noise ratio and large spurious dynamic range, the feedback DAC must be designed for low noise and jitter, and the input sum node and loop filter must be sufficiently linear and low in input equivalent noise to enable the improved dynamic range sought. The DAC nonlinearity can be corrected digitally, when multiple bits are employed, by means of Nonlinear Filter Error Correction as described in U.S. Pat. No. 6,271,781, issued in the name of Pellon. To achieve a particular resolution, full precision is not required in the DAC as a result of oversampling and uniquely adapted error correction for each DAC; however, the highest DAC precision is desirable since the degree of nonlinearity error correction required is reduced, and thus, the error that would result from changes in the DAC nonlinearity produced through temperature changes in the operating environment. Other techniques have also been developed, known as Dynamic Element Matching, which also be used to mitigate multibit DAC error effects.

Finally, to minimize latency, the DAC is implemented within a highly integrated ADC-DAC that must also exhibit sufficiently low noise densities associated with the metastable or ambiguous response of the ADC to signal inputs near its thresholds. The latency required to achieve the required DAC spectral purity can often exceed a clock cycle.

The improvement in quantization noise dynamic range due to loop filtering reduces as the pass band bandwidth is increased, where the noise shaping zeros, produced by the feedback loop, must be spread over a greater pass band. This spreading reduces the mean attenuation attained. Increasing the number of zeros can improve performance but with diminishing advantage as the loop filter order is increased. Stability is affected, particularly for pass bands that are a significant fraction of the Nyquist frequency, such as ⅛ to ¼. In prior art continuous-time sigma-delta modulators, the bandwidth is set relative to a frequency which is the inverse of the loop latency. Ideal continuous-time sigma-delta modulation requires a single whole clock cycle delay equal to one sampling interval; however, in practice, the actual delay available is based on the sum of component latencies, which can exceed several clock cycles, and is not a whole number. This is particularly true when, for a given transistor technology, the highest possible sampling rate in the quantizer and the highest possible amplifier bandwidth in the loop filter are employed to achieve improved pass band bandwidth. Prior art techniques exist for compensating the effect of this latency to achieve stable operation with control over the pole and zero locations; however, the noise shaping attenuation as a function of pass band bandwidth is reduced as a result of this latency.

One such sigma-delta configuration includes a degenerative feedback loop including an analog-to-digital converter which digitizes the feedback signal and a digital-to-analog converter which generates an analog version of the digital output signal, together with a differencing circuit which subtracts the analog version of the digital output signal from the input signal to form a difference or error signal. This error signal is resonated by a recursive transversal implementation of the loop filter and applied to the underlying low resolution sampling analog-to-digital/digital-to-analog converter (ADC-DAC). The degeneration occasioned by the negative feedback tends to suppress the inherent noise of the underlying quantizing ADC, as well as tending to correct the value of the digital signal toward that of the analog input signal. This configuration employs transversal delays set in accordance with the latency achieved in the primary feedback loop. The latency of the sum node, loop filter and the quantizing ADC-DAC are combined to form the minimum realizable transversal delay. The inverse of this delay is termed the maximum periodic frequency of the recursive transversal filter. The attenuation as a function of bandwidth is determined as a fraction of this periodic frequency. This is often much less than the sampling frequency as a result of the component latencies, when designed for sufficient linearity, isolation and spectral purity. This is particularly true when considering very high clock rates, such as four or twenty gigasamples per second, higher order multistage loop filters that typically have orders between 2 to 10 and multibit quantizing ADC-DACs with between 2 to 8 bits of resolution.

FIG. 1 is a simplified block diagram of a sigma-delta (ΣΔ) analog-to-digital converter or encoder as described in U.S. Pat. No. 5,608,400, issued Mar. 4, 1997 in the name of Pellon. IN FIG. 1, analog input signals x(t) which are to be converted to digital form are applied to an input port 12. The analog input signals are band-limited, as would be the case, for example, if they were modulated onto a radio-frequency (RF) or intermediate-frequency (IF) carrier. FIG. 2a illustrates an idealized amplitude—(A) versus-frequency plot of a band-limited analog input signal spectrum 210 centered on an IF frequency. The analog input signals applied to input port 12 are coupled to a first input port $14i_1$ of a summing circuit 14, where they are combined with a signal applied to a second input port $14i_2$ of summing circuit 14 by way of a signal path 16. The summed signals are coupled from summing circuit 14 by way of a path 18 to a first input port $20i_1$ of a further summing circuit 20. Summing circuit 20 sums the signals applied to its first input port 20i from signal path 18 with analog signals applied to its second input port $20i_2$ from a signal path 22, to produce a summed signal at its output port 20o, which is coupled onto signal path 24. Summing circuits 14 and 20 together may be viewed as a three-input-port summing circuit, which produces a summed signal on signal path 24. The three input ports, taking this view, are $14i_1$, $14i_2$, and $20i_2$.

A coupling arrangement 26 of FIG. 1 receives signals applied from signal path 24 at its input port 26i, and couples them to an output port 26o and a signal path 28. Coupling arrangement 26 also samples the signals traversing from its input port 26i to output port 26o to a tap or sample port 30, for reasons described below. The signals coupled from output port 26o of coupling arrangement 26 onto signal path 28 are applied to an input port 32i of an analog-to-digital converter (ADC) 32, which is sampled at a clock rate by a clock signal applied to a clock input port 32c from a signal path 34. Analog-to-digital converter 32 samples digital signals applied to its input port 38i at the clock rate, and converts the signals into digital form. Those skilled in the art know that the noise of ADC 32 may be represented as a noise signal e(n) applied to a effective noise input port 32n, and that such an ADC should have low latency or time delay, and that it may be desirable to sacrifice resolution (number of bits) to achieve higher speed. The digital signal is generated as $y_n$ on output port 32o. The digital signal from port 32o is applied to a system output port 40o, and is also applied by an output signal path 40 to an input port 38i of DAC 38. A clock signal generator 36 generates clock signals at a clock frequency $f_s$, which are applied by way of signal path 34 to clock input port 32c of ADC 32 and to a clock input port 38c of a digital-to-analog converter (DAC) 38. Those skilled in the art know that the noise of the DAC 38 may be represented as a noise signal g(n) applied to a effective noise input port 38n.

Digital-to-analog converter 38 of FIG. 1 receives the digital signal applied over signal path 40 from output port 32o of ADC 32, and converts the digital signal into analog form at the clock rate. As is known to those skilled in the art, a zero-order hold spectral response, illustrated as a block 42, is generally inherent in DAC 38. DAC 38 produces its analog signal output at an output port 38o. An amplitude equalizer 44 is provided. Equalizer 44 has an amplitude response selected to flatten or compensate, up to a cutoff frequency $f_{CO}$, for the magnitude response of the zero-order hold 42 of DAC 38, as described in more detail below. Equalizer 44 is coupled to the second input port $14i_2$ of summing circuit 12 and to output port 38o of DAC 38 by a coupling circuit, which includes at least one direct-current (DC) blocking or AC-coupling path. As illustrated in FIG. 1, the coupling circuit includes a capacitor 46 coupled to output port 38o of DAC 38 and to input port 44i of equalizer 44, together with an all-pass conductive signal path 16 coupled between output port 44o of equalizer 44 and second input port $14i_2$ of summing circuit 12. The positions of capacitor 46 and all-pass conductor 16 could be interchanged, if desired. The described connections establish a main degenerative loop suggested by an arrow 48. In a preferred embodiment of the structure of U.S. Pat. No. 5,608,400, the equalizer is an elliptical filter.

The sigma-delta analog-to-digital converter 10 of FIG. 1 also enhances the open-loop gain of main loop 48 at a frequency, which as described below is selected to include the IF frequency (or any other desired frequency) at which the analog input signal is centered. The open-loop gain of the main loop 48 is enhanced by a regenerative or positive-feedback loop (resonator), suggested by an arrow 50, embedded in the main loop. Regenerative feedback loop 50, as illustrated in FIG. 1, includes a low-pass filter (LPF) 52, an aliasing resonance null filter 54, and a DC blocking or AC-passing capacitor 56, coupled in cascade, by conductors designated generally as 22, between tap port 30 of coupling arrangement 26 and input port $20i_2$ of summing circuit 20. The cascade of LPF 52, null filter 54, and DC blocking capacitor 56, is interconnected by a delay line 58, conductors 22, and a loop gain element or amplifier 60. The regenerative loop 50 thus includes not only delay line 58, LPF 52, null filter 54, amplifier 60, and capacitor 56, but also includes a portion of summing circuit 20, together with that portion of coupling arrangement 26 which lies between input port 26i and tap port 30. The portion of coupling circuit 26 included within regenerative loop 50 contains a phase (ϕ) shifter 62. Coupling circuit 26 also includes a gain element 64 associated with main degenerative feedback loop 48 and a further delay element 66.

Low-pass filter 52 of FIG. 1 has an amplitude response which is selected to be equal to the open-loop response of main degenerative feedback loop 48, up to a cut-off frequency $f_{CO}$. FIG. 2b illustrates a simplified response 222 of low-pass filter 52, with cut-off frequency of $f_{CO}$, and with the effect of DC blocking capacitor 56 near zero frequency. In general, the response of LPF 52 includes a flat or constant amplitude portion up to the cut-off frequency (frequency at which the amplitude response begins to decrease), which lies somewhat above the IF frequency of FIG. 2a. The Nyquist frequency (one-half of the clock frequency) is illustrated as $f_N$.

Closing of the regenerative loop 50 of FIG. 1 will generate a gain pole at a selected resonance frequency, which is one of a comb of resonance frequencies. The period of the comb, which is the frequency interval between "teeth" of the comb, is the inverse of the delay around the regenerative loop 50, and thus is affected by the delay inherent in the components of the loop, the interconnection conductors of the elements of the loop, and by the time delay of delay element 58. FIG. 2c illustrates the open-loop amplitude-frequency resonant peak response of the regenerative feedback loop 50, in the absence of filters 52 and 54; the response defines a comb response 212 including a selected or first response peak 214 at the IF frequency at which the analog input signal is centered, and two additional response peaks 216 and 218 of the comb. Response peak 218 is illustrated as being centered on a frequency $f_A$. Near zero frequency, response 212 of FIG. 2c decreases to zero amplitude due to the presence of AC coupling capacitor 56. The response in the absence of AC coupling is illustrated by dash line 220. The attenuation of the closed-loop bandwidth above frequency $f_{CO}$ by the characteristics of filter 52, illustrated in FIG. 2b, enhances stability by reducing the importance of the tolerances of components of the continuous-time filters.

The response of aliasing resonance null filter 54 of FIG. 1 is illustrated as 226 in FIG. 2d. As illustrated therein, plot 226 exhibits a null at frequency $f_A$, the same frequency at which the third resonant peak 218 of the regenerative response 212 occurs.

FIG. 10 illustrates a phase versus frequency plot 1010, which represents the step phase shift produced by phase shifter 62 of regenerative loop 50 of FIG. 1. The phase shift ϕ illustrated by plot 1010 has a constant value above zero Hertz, and a corresponding negative value below zero Hertz. This response is ideally $$H_\phi(j\omega) \approx \frac{1}{2}[(1 + \text{sign}(\omega))e^{-j\phi} + \quad (1)$$
$$(1 - \text{sign}(\omega))e^{j\phi}]$$
$$= \cos(\phi) - j\,\text{sign}(\omega)\sin(\phi)$$

where $$\text{sign}(\omega) = \begin{cases} +1, & \omega > 0 \\ 0, & \omega > 0 \\ -1, & \omega < 0 \end{cases}$$

Also illustrated in FIG. 10 is the phase shift 1012 introduced by delay element 58 of FIG. 1, which, as known, slopes with frequency. Plot 1014 of FIG. 10 illustrates the net phase response around the regenerative loop. If the magnitude of the step phase shift is increased, the offset of the net phase shift increases at all frequencies, thereby affecting the frequency at which the resonant loop resonates.

The open-loop gain of the regenerative loop 50 of FIG. 1 is set to unity, and the open-loop phase is set to zero, or to an integer multiple of 360°, at the selected resonance frequency, which in FIG. 2c is the frequency of the first resonance peak 214. However, the selected resonance frequency could be selected to be the frequency of one of the other resonance peaks of the comb, such as peak 216 or peak 218. Setting of the open-loop gain is accomplished by adjusting the gain of loop gain amplifier 60 of FIG. 1, or alternatively by applying a selected amount of attenuation in the regenerative loop. The open-loop phase is set to 0° or to N times 360° by adjusting the combination of the value of delay line 58 and/or the phase of phase shifter 62. The value or magnitude of the delay, without the phase-shifter, establishes the base frequency of the first or lowest-frequency resonance (the frequency of resonance 214 of FIG. 2c), and the frequency increment between each resonance and the next higher resonance (the comb interval). The addition of a phase-shift over and above the delay moves the resonant frequency of the first or lowest-frequency resonance, without changing the interval between each resonance and the next. For purposes of the description of U.S. Pat. No. 5,608,400, the term "phase-shift" or "phase-shifter" includes elements or circuits which accept a real-valued signal at their inputs, and which produce real-valued signals at their outputs, with a constant phase value (or constant value of phase shift) therebetween as a function of frequency at frequencies greater than zero Hz. At negative frequencies, these phase shifters mirror the phase response at positive frequencies, but with a negative sign. Such phase shifters may be implemented by all-pass ladders or lattice filters, as known in the art, but the exact method of implementation is not critical.

It should be noted that phase shifter 62 of FIG. 1 is located in both the main and the regenerative loops, but could alternatively be located solely in the regenerative loop, to give individual control to the regenerative loop phase, so long as another phase shifter were to be located solely in the main degenerative loop. In special cases, and especially in higher-order resonators, described below, phase shifter 62 is dispensed with entirely, and the desired phase shift is established by the cumulative phase shifts of the other elements of the main and regenerative loops. This is because the phase shifter circuits introduce phase nonlinearity and magnitude error in the form and phase and magnitude ripple error near the center frequency. Each particular higher order arrangement will have a corresponding set of gain and phase error margins, or margins relative to the stable condition of the closed-loop system. Elimination of the phase shifter elements in some of the arrangements assists in meeting the desired gain and phase margins, to thereby improve stability, and also has the advantage of a reduced parts count. In such arrangements lacking phase shifter elements, the gain is set as before, and the required phase of 0° or an integer multiple of 360° is obtained at the desired resonant frequency by the combined phase shifts of the components and adjusted delay element.

As a result of the sampling operation in ADC 32 of FIG. 1, components above frequency $f_N$ of FIG. 2c will alias to frequencies below $f_N$. This aliasing will produce an effective resonance function other than that illustrated, representing that seen by the closed loop at the output of the ADC 32. The effective resonance will contain undesired gain components, which may affect the stability of the closed-loop sigma-delta ADC 10. Plot 228 of FIG. 2e illustrates an idealized amplitude-vs-frequency response 228 representing the result of combining the regenerative loop response 212 of FIG. 2c with the low-pass filter response 222 of FIG. 2b and the null-filter response 226 of FIG. 2d. The transfer function represented by plot 228 is $$R_{11} = \frac{N(s)}{D(s)} = \frac{N(s)}{1 - B(s)} = \frac{H_\phi(s)e^{-sTd2}}{1 - GH_\phi(s)H_{B1}(s)H_{B2}(s)e^{-sTd1}} = \quad (2)$$

where:
- $H\phi(s)$=Laplace Transform of a Bandpass Phase Shifter Function;
- $H_{B1}(s)$=Laplace Transform of Filter Required to Match Primary Feedback Path;
- $H_{B2}(s)$=Laplace Transform of the Notch Filter For Suppressing the First Resonance above the Nyquist Frequency $f_N$;
- $e^{-sTd1}$32 Laplace Transform of Delay Line which combines with other delays in the regenerative loop to form the entire delay $T_e$;
- $e^{-sTd2}$=Laplace Transform of Delay Line which combines with component delays in the primary loop to form the entire delay $T_e$; and
- $B(s)=GH_{\phi(s)HB1}(s)H_{B2}(s)$=open loop response of the regenerative loops.

As illustrated, the effect of the two filters on the regenerative loop response 228 is negligible at frequencies below cutoff frequency $f_{CO}$. Above frequency $f_{CO}$ the cutoff of the low-pass filter progressively attenuates the response, and the resonance peak at $f_A$ is attenuated by the null filter response to a value below unity gain, illustrated as a level 230. This combination of responses tends to reduce all of the unwanted effective resonant peaks of the regenerative loop, restoring a stable condition. To suppress the effect of aliased components, the gain produced by the regenerative loop at frequencies greater than $f_N$ must be suppressed to a level sufficient for stability, which is represented by dot-dash line 230. In the process of transitioning from the desired high gain at the IF frequency to the low loop gain at $f_A$, regenerative peak 216 can have a gain exceeding unity. Thus, plot 228 of FIG. 2e represents the closed-loop regenerative gain of the regenerative loop 50 of FIG. 1.

In FIG. 2f, dot-dash plot 242 represents the open-loop transfer function seen by the closed-loop sigma-delta modulator, in the absence of a cutoff filter response, such as that of plot 222 of FIG. 2B. Plot 242 has an undesired peak at a frequency $f_z$, where $f_z=2f_N-f_A$, as a result of aliasing produced by the ADC and DAC, which sample at $f_S=2f_N$. This aliasing gain peak is undesired because it causes the gain and phase margins to be exceeded, thereby resulting in instability. In FIG. 2f, plot 244 represents the components produced by aliasing of components of plot 228 of FIG. 2e which lie above $f_N$. Plot 244 has a response which is suppressed at all frequencies, attributable at least in part to the cutoff above frequency $f_{CO}$, so that it has negligible effects on system performance. FIG. 2f represents as a plot 240 the effective open-loop response of the entire sigma-delta loop of the arrangement of FIG. 1. The term "effective" is used to indicate the open-loop transfer function seen by the closed-loop sigma-delta modulator, which differs from that of FIG. 2e as a result of the sampling process in the analog-to-digital converter 32 of the loop and the analog reconstruction process in the digital-to-analog converter 38. Plot 240 is the sum of components below $f_N$ of plot 228 of FIG. 2e with components represented by plot 244 of FIG. 2f.

FIG. 3 illustrates the open-loop response of zero order hold 42 of FIG. 1 as a plot 310, the open-loop response of filter 44 as 312, and the combined response from input port 38i of DAC 38 of FIG. 1 to output port 44o of filter 44 as 314. Near zero frequency, the combined response 314 tends toward zero amplitude because of the effects of DC blocking capacitor 46. When both the regenerative loop 50 and the main degenerative loop 48 are closed, two transfer functions develop, a first signal transfer function $H_x(\omega)$, where $\omega$ is $2\pi f/f_s$, between the system signal input port 12 and the system output port 40$_0$, and the second noise transfer function, $H_e(\omega)$, between effective noise input port 32n of ADC 32 and system output port 40$_0$. Noise transfer function $H_e(\omega)$ will exhibit attenuation at frequencies at which open-loop resonance gain is high, as at frequency $f_{IF}$ of the selected resonance. Thus, the described system tends to reduce noise at signal frequency $f_{IF}$. The signal transfer function $H_x(\omega X)$ exhibits near-unity gain at frequency $f_{IF}$, so the signal is not significantly attenuated, thereby improving the signal-to-noise ratio (SNR) at the system output. Additionally, since $f_{IF}$ can be moved at will by adjustment of the phase shift in the regenerative or resonant loop 50, the band of high SNR can be readily adjusted.

FIG. 4 illustrates the response or performance of the arrangement of FIG. 1 with both the regenerative loop and the main degenerative loop closed. In FIG. 4, the gain of the signal transfer function $H_x(\omega)$ is plotted as dash line 412, and the noise transfer function $H_e(\omega)$ is 410. As illustrated, plot 412 is flat, and has essentially unity signal gain for all frequencies of interest, while plot 410 has a noise null at and near frequency $f_{IF}$.

Equations (3) and (4) represent the general (regardless of order) transfer functions $H_x(\omega)$ and $H_e(\omega)$.

$$H_{xp}(s) = -H_{xp}(s) = \frac{[R_{nm}(s)e^{-sT_e}]_p}{1 + [H_r(s)R_{nm}(s)e^{-sT_e}]_p} \quad (3)$$

$$= \frac{N_p(s)}{K_p(s)} = \text{signal transfer function}$$

where:
- $Hx(s)$=the signal transfer function of the continuous-time closed loop system;
- $Rnm(a)$=continuous-time resonator transfer function for a resonator of order n, having m stages of cascading=$Nnm(s)/Dnm(s)$;
- and the additional subscript p indicates sampling rather than continuous time.

$$H_{ep}(s) = \frac{1}{1 + [H_r(s)R_{nm}(s)e^{-sT_e}]} = \frac{D_p(s)}{K_p(s)} \quad (4)$$
$$= \text{Noise Shaping Transfer Function}$$

where:

$H_e(s)$=the noise transfer function of the continuous-time closed-loop system; and subscript p denotes sampling. In equations (3) and (4), the function $H_r(s)$ represents the combined open-loop response of filters 42 and 44 of FIG. 1, where filter 42 represents switching operations within the digital-to-analog converter. More specifically, this open-loop response is given by $$H_r(s) = H_{ZOH}(s)H_{eq}(s) \quad (5)$$

where $H_{ZOH}(s)$=Laplace Transform of zero order hold DAC reconstruction filter; and $H_{eq}(s)$=Laplace Transform of Elliptical Filter Required to Equalize the DAC zero order hold to produce a flat channel up to the IF frequency band selected.

Equations (3) and (4) incorporate an aliasing operator denoted by subscripted bracketed functions of the form [ ]p, where $$[F(s)]_p = k_s \sum_{k=-\infty}^{\infty} F(s - j\omega_s k) \quad (6)$$

and $k_s$ is a gain-normalizing constant. Operator $[F(s)]_p$ produces a periodic spectrum in response to a nonperiodic spectral input function. The periodicity of the aliasing function is $f_s$, the sampling frequency. The effect of the aliasing operator is to sum the shifted components of the input spectrum over Nyquist bands, where Nyquist bands are defined as the spectra ($nf_s$–$f_N$) to ($nf_s$+$f_N$]), where n is an integer. In equations (3) and (4) one can define an effective resonance transfer function as $$R_{effp}(s) = [H_r(s)R_{nm}(s)e^{-sT_e}]p \quad (7)$$

Plot 240 of FIG. 2*f* represents the amplitude component of the effective resonance transfer function. The application of the aliasing operator to the open-loop transfer function combines the primary components of the resonance transfer function and the aliased components above $f_N$ in FIG. 2*e*. This resonance transfer function is perfectly periodic with frequency. For the first-order system of FIG. 1, the closed-loop transfer function is given by $$H_e(s) = \frac{1 - H_\phi(s)H_B1(s)H_B2(s)e^{-sTD^1}}{1 - H_\phi(s)H_B1(s)H_B2(s)e^{-sTD^1} +} = \frac{D(s)}{K(s)} \quad (8)$$
$$H_{eq}(s)H_{ZOH}(s)H_\phi(s)e^{-sTD^2}$$

where:

$e^{-sT_{para}}$=Laplace Transform of the parasitic delay, $T_{para}$, which is produced by the components and interconnects in the primary feedback loop (e.g., Amplifiers, summing nodes, splitting nodes, A/D and DAC).

In equation (8), the numerator produces a null response at the desired resonance frequency $f_{IF}$, as indicated by plot 410 of FIG. 4. In the numerator term, the combined open-loop response of the regenerative loop 50 of FIG. 1 is aligned so that at the frequency of interest $f_{IF}$, the magnitude of the response is unity, and the phase is zero degrees or a multiple of 360°. The denominator term of equation (8) includes the same function as is found in the numerator, plus the response of the open-loop main path 48 of FIG. 1. To achieve stability when the main and regenerative loops are closed, the individual responses of the loops are matched well enough to cancel each other. Equation (8) incorporates a polynomial multiplied by an exponential, and does not necessarily have a discrete solution, as would an equation with discrete poles and zeroes. Equations with discrete poles and zeroes include functions which are polynomials or a weighted sum of exponentials, but not a product of polynomials and exponentials. Thus, stability is not determined or defined by the locations of discrete poles in equation (8), but instead must be defined by a more general stability criterion. Control theory indicates that a return function T(s) can be defined as the denominator of the closed-loop transfer function K(s), minus one, T(s)=K(s)–1. Stability can be determined for such a closed-loop system from a Nyquist diagram of T(s). A Nyquist diagram has the real and imaginary parts of the return function plotted along corresponding mutually orthogonal axes, with s equal to jω, and ω swept over all frequencies. Stability is guaranteed when the Nyquist plot so made does not encircle the –1 point on the real axis. Thus, to guarantee stability, the open-loop transfer functions as defined above must be matched well enough in equation (8) to insure this condition. Ideally, when the regenerative and main open loop responses are perfectly matched, the Nyquist diagram will be a point at the origin. Such a response cannot realistically be achieved, but it can be approximated sufficiently for stability. The arrangement according to U.S. Pat. No. 5,608,400 allows this matching to be achieved in the presence of aliasing, which in turn allows stable sigma delta modulators to be made in which the desired signal gain and noise rejection are achieved at frequencies independent of the sampling rate.

FIG. 5 illustrates a sigma-delta analog-to-digital converter 510, which includes a higher-order embodiment of the resonator than does the arrangement of FIG. 1. The higher-order resonance structure implements multiple selectable poles and zeroes in the form of a single-stage recursive transversal filter (RTF). The poles are selected to enhance the resonance gain peak at a selected frequency or over a band of frequencies. The zeroes are selected for stability in the closed-loop condition, thereby providing increased attenuation at the frequency or band of frequencies in the noise transfer function $H_e(\omega)$ Elements of FIG. 5 corresponding to those of FIG. 1 are designated by like reference numerals. In FIG. 5, coupling arrangement 526 extending between output port 20*o* of summing circuit 20 and input port 32*i* of ADC 32 is different from coupling arrangement 26 of FIG. 1. Coupling arrangement 526 includes an input port 526*i* coupled to the output port 20*o* of summing circuit 20, and its third port 530 is coupled directly to its input port 526*i*. Coupling arrangement 526 of FIG. 5 includes a gain element 564$_1$, a phase shifter 563$_1$, a summing circuit 5701, and a time delay element 66, cascaded in the stated order between input port 526*i* and output port 526*o*. As in the case of the arrangement of FIG. 1, delay element 66 is within the main loop, but is not within a resonant loop. The placement of phase shifter 563$_1$ in FIG. 5, on the other hand, is within the main degenerative feedback loop 48, but not within the multiple resonant loops.

The arrangement of FIG. 5 includes multiple regenerative or resonant loops, a first of which is designated $550_1$, and a second of which is designated $550_2$. The first resonant loop $550_1$ includes delay element 58, LPF 52, null filter 54, tap point $572_1$, gain element $60_1$, a phase shifter $562_1$, summing circuits $520_1$ and 20, signal path 24, and third port 530. As mentioned previously in conjunction with FIG. 1, independent phase control of the main loop and a regenerative loop, such as of regenerative loop $550_1$, may be accomplished by means of separate phase shifters in each of the degenerative and main loops. Thus, phase shifter $562_1$ of regenerative loop $550_1$ is matched by phase shifter $563_1$ in a main loop portion $48_1$; thus, degenerative main loop 48 in the arrangement of FIG. 5 includes a plurality of portions, all of which include ADC 32, DAC 38, DC blocking element 46, equalizer 44, path 16, summing circuits 12 and 20, and path 24 to port 530. All of the branches of main or degenerative loop 48 extend from port 30 of coupling circuit 526 to input port $32i$ of ADC 32. The first branch $48_1$ of the main or degenerative loop 48 includes gain element $564_1$, phase shifter $563_1$, summing circuit $570_1$, and trim delay line 66. The second resonant loop $550_2$ includes delay element 58, LPF 52, null filter 54, tap point $572_1$, delay element $558_1$, tap point $572_2$, gain element $60_2$, a phase shifter $562_2$, summing circuits $520_2$, $520_1$ and 20, signal path 24, and port 530. A corresponding second branch for phase control for the main loop is provided by a path extending from tap port 530 of coupler 526 to input port $32i$ of ADC 32, which path includes delay line 58 (if provided), LPF 52, null filter 54, tap point $572_1$, a gain control element $564_2$, and a phase shifter $563_2$ cascaded in a path extending between tap point $572_1$ and an input port of summing circuit $570_2$, and also includes summing circuits $570_2$ and $570_1$. As suggested by dash lines $574_1$ and $574_2$ extending from tap point $572_2$ and summing circuit $520_2$, respectively, of FIG. 5, additional resonant loops may be added by extending the recurrent structure of the illustrated resonant loops to further branches. As suggested by dash lines $578_1$ and $578_2$ extending from tap point $572_2$ and summing circuit $570_2$, respectively, additional corresponding branches of the main loop may be added in the same manner.

In equations (3) and (4), the effective resonance transfer functions are denoted by subscripts n and m, where n represents the order of the recursive transversal filter (resonator) of FIG. 5, and m represents the number of cascade stages in the RTF. Thus, m is unity in the case of FIG. 5. For orders (n) greater than one, the effective resonance is given by $$R_{nm}(s) = \frac{\prod_{i=1}^{m} N_i(s)}{\prod_{i=1}^{m} D_i(s)} = \frac{N(s)}{D(s)} = \frac{N(s)}{1-B(s)} \tag{9}$$

where $$B(s) = \prod_{i=1}^{m}(1-B_i(s))-1 \tag{10}$$

$$B_i(s) = H_{Bi}(s)H_{oi}(s)\sum_{l=1}^{L_i} B_{li}H_{Bli}(s)e^{-slT_e} \tag{11}$$

$$N_i(s) = H_{oi}(s)\sum_{l=1}^{L_i-1} A_{li}H_{A_{li}}(s)e^{-s(l-r)T_e} \tag{12}$$

This higher order of the effective resonance will produce increased noise attenuation over a specified bandwidth centered at a desired frequency $f_{IF}$, as shown by plot 642 of FIG. 6c. Stability is insured in the multipole context by a criterion similar to that used in the first-order system, namely that of equation (8). In the multipole context of FIG. 5, the denominator of the closed-loop transfer function is given by $$K(s)=1-B(s)+N(s)e^{-sT_e} \tag{13}$$

so that the return function is given by $$T(s)=N(s)e^{-sT_e}-B(s) \tag{14}$$

To illustrate the above-mentioned stability criterion in relation to equation (12), a selection for the weights used in paths $550_1$, $550_2$, . . . and the weights used in corresponding feedforward paths $48_1$, $48_2$ of recursive transversal filter or resonator 50 of FIG. 5 might be such that the weight of each feedforward path ($48_1$) is equal to the weight of the corresponding feedback path ($550_1$) When this equal-weight condition prevails, the idealized closed-loop noise transfer function exhibits a finite-impulse-response (FIR) characteristic such that a Nyquist diagram of the response is represented as a point at the origin. Mismatches are to be expected between the functions N(s) and B(s), arising from the actual, as opposed to theoretical, performance of the bandlimiting filters 42, 44, 52, and 54 of FIG. 5, and from gain and phase variation of components (amplifiers, attenuators, delay lines, etc. which are used. Note that it is not possible to ascribe the function N(s) solely to filters 42 and 44, because filters 52 and 54 affect N(s). Thus, in practice the stability of the arrangement of FIG. 5 is guaranteed by requiring adequate matching of the filter characteristics, to avoid encirclement of the point −1 on the real axis of the Nyquist diagram when the weighting is applied. Once the bandlimiting filters have been designed for stability using FIR weighting in the RTF as described above, the FIR filter weighting can be replaced by IIR weighting, and stability is maintained.

FIG. 6a illustrates an amplitude-frequency spectrum of an analog input signal 610 centered at a frequency $f_{IF}$, which may be applied to the sigma-delta analog-to-digital converter 510 of FIG. 5. FIG. 6b illustrates the open-loop spectral response 612 of the resonant loops $550_1$, $550_2$, . . . of the arrangement of FIG. 5, as affected by combining the regenerative loop responses with the response of low-pass filter 52 and the response of null-filter 54. As illustrated, response 612 includes a multiple-pole gain peak 614, resulting from the multiple resonant poles, extending over a bandwidth about $f_{IF}$ which includes the analog frequencies. This open-loop gain peak, when both the regenerative and degenerative loops are closed, results in low through loss at the signal frequencies. Plot 612 also includes additional poles 616 and 618, in which pole 616 is below the Nyquist frequency $f_N$, and pole 618, which is above the Nyquist frequency, has a gain of less than the maximum stable gain, which is represented by line 630. FIG. 6c illustrates by a plot 640 the gain of the analog-to-digital converter 510 of FIG. 5, with all the resonant and degenerative feedback loops closed. The solid-line plot 642 of FIG. 6c represents the response of the loop on noise e(n) injected into port $32n$ of ADC 32 of FIG. 5, with a multipole null centered on frequency $f_{IF}$, to suppress the noise at system output path 40. The dash-line path 644 illustrates the overall gain response of the sigma-delta analog-to-digital converter 510 to the signal. As illustrated, the signal gain is much greater than the gain applied to the noise. Ideally, the signal gain is unity. As described above in relation to FIG. 1, the multiple resonant frequencies at which the noise rejection is high in null 642 of FIG. 6c can be adjusted by selecting the time delays of delay elements 58, 66, $558_1$, . . . , and, in pairs, the phase shifts of phase shifters $562_1$, $563_1$; $562_2$, $563_2$; . . .

In the ordinary sigma-delta ADC, the two bandwidth-draping functions are implemented as recursive transversal filters. These RTF provide a tradeoff between depth of filtering and latency or time delay, because more elements are needed in the filter for greater depth of filtering, but the additional elements add to the delay.

As it so happens, in present-day sigma-delta analog-to-digital converters, the latency of the loop filter or resonator is on the same order of magnitude as the latency of the combination of the ADC and the DAC in the feedback loop, and as a result, both contribute to the overall loop delay, and together limit the maximum bandwidth.

Wideband sigma-delta analog-to-digital converters, andor improved or alternative continuous-time loop filter sigma-delta modulators that enable wider pass band bandwidths are desired.

SUMMARY OF THE INVENTION

The inventor herein has discovered that it is possible to isolate the latency of the loop filter or resonator from that of the combination of the ADC and DAC. In effect, the cascade of such latencies or delays around a feedback loop are avoided by the isolation afforded by two parallel degenerative feedback loops with a common sum node Those skilled in the feedback arts will recognize that decreasing the delay in a feedback path raises the frequency at which a particular phase shift occurs. This improves the performance of the loop, particularly at wider bandwidths.

According to a first aspect of the invention. a sigma-delta analog-to-digital converter, which may operate with either single or multiple bits, converts band-limited analog signals into corresponding digital signals. The analog-to-digital converter comprises a loop sampling and quantization analog-to-digital converter element including an input port, and an output port at which output digital signals are generated in response to resonated difference signals applied to the input port. The sigma-delta analog-to-digital converter also includes a loop digital-to-analog converter including an input port coupled to the output port of the loop analog-to-digital converter element, for generating an analog reconstruction feedback signal from the output quantized digital signals. An input summing arrangement includes a first input port coupled for receiving the band-limited analog signal and an output port coupled to the input port of the loop sampling and quantization analog-to-digital converter element and coupled to the input port of a filtering element, where the signal at this node is referred to as resonated difference signals. This input sum node arrangement also includes two additional input ports for summing the band-limited analog signal with two feedback signals, where the first feedback signal is the analog reconstruction of the output quantized digital signals, thereby forming a primary feedback loop that is degenerative, and the second feedback signal is composed of filtering means the produce filtered resonated difference signals, thereby forming a second feedback loop that is regenerative. The combined effect of the sum node and second feedback loop is to form a difference signal between the input signal and the feedback digital-to-analog converter signal and to form the resonated difference signals as a result of the second feedback loop. The loop sampling and quantization analog-to-digital converter element, the loop digital-to-analog converter, and the input summing arrangement are coupled in the first loop having a first loop delay. The sigma-delta analog-to-digital converter also includes an analog "protoresonator" filter including a single input port coupled to receive the resonated difference signals, and also including an output port at which the filtered signals are generated. The output port of the protoresonator is coupled to a second input port of the summing arrangement, to form a second loop including the analog protoresonator filter and the input summing arrangement. The second loop is regenerative and has order greater than one, (that is, two or more) where order is the number of weighted transversal delays, corresponding to the number of taps on the delay line associated therewith.

In a particular avatar of this aspect, a sigma-delta analog-to-digital converter input summing arrangement comprises a first summing circuit including a first input port coupled to receive the band-limited analog signal and a second input port coupled to receive one of the filtered signals and the analog reconstruction of the digital output signals, for summing the one of the filtered signals and the analog reconstruction of the digital output signals with the band-limited analog signal, to thereby generate an intermediate signal. The input summing-arrangement also includes a second summing circuit including a first input port coupled to receive the intermediate signal and a second input port coupled to receive the other one of the filtered signals and the analog reconstruction of the digital output signals, for summing the intermediate signals with the other one of the filtered signals and the analog reconstruction of the digital output signals, to thereby generate the resonated difference signals. In one version, the one of the filtered signals and the analog reconstruction of the digital output signals is the analog reconstruction of the digital output signals, and the other one is the filtered signals.

In another manifestation of the aspect of the invention, the loop sampling and quantization analog-to-digital converter element, the loop digital-to-analog converter, and the first summing circuit are located within a first loop, and the first summing circuit and the protoresonator filter are located within a second loop, whereby the first summing circuit is a common element within the first and second loops. The sigma-delta analog-to-digital converter further comprises a delay coupled in one of the first and second loops for tending to equalize the delay around the first and second loops for stabilizing the sigma-delta analog-to-digital converter.

BRIEF DESCRIPTION OF THE DRAWING

FIGS. 2a, 2b, 2c, 2d, and 2e are referred to jointly as FIG. 2;

FIG. 3 represents the idealized amplitude-frequency response of a portion of the main degenerative feedback loop of FIG. 1;

FIG. 4 is an idealized amplitude-frequency plot which illustrates the performance of the arrangement of FIG. 1 with both the regenerative loop and the main degenerative loop closed;

FIG. 7 is a simplified block diagram of a sigma-delta analog-to-digital converter according to an aspect of the invention, having order 2, while

DESCRIPTION OF THE INVENTION

Figure 1:
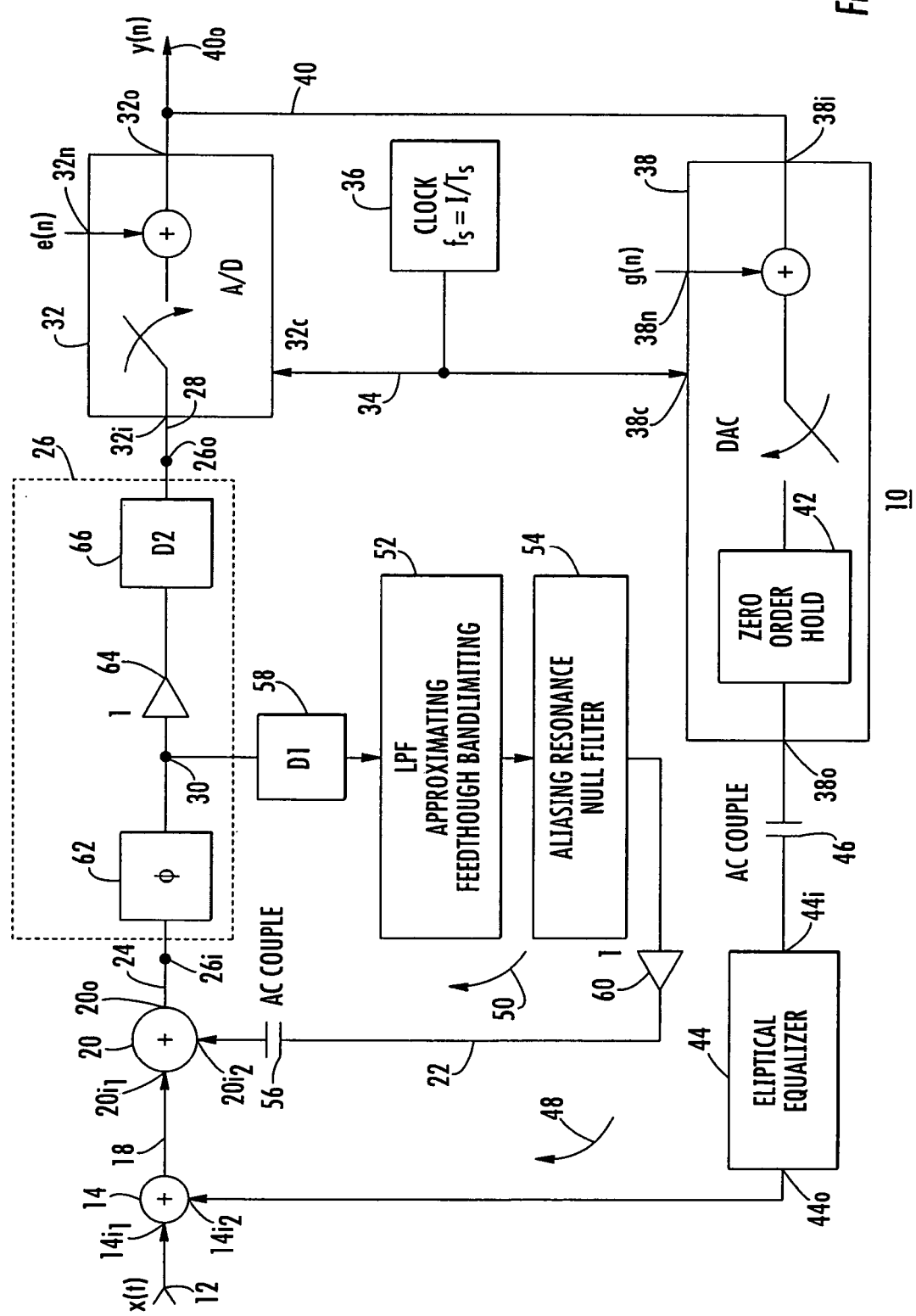
FIG. 1 is a diagram, in simplified block and schematic form, of a prior-art sigma-delta analog-to-digital converter as described in U.S. Pat. No. 5,608,400, including a degenerative main feedback loop and a gain-enhancing regenerative feedback loop embedded in the main loop.
Figure 2A:
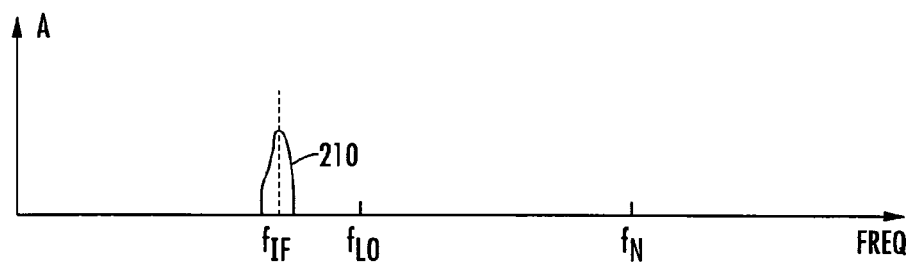
FIG. 2a is an idealized amplitude-frequency plot of a band-limited analog input signal.
Figure 2B:
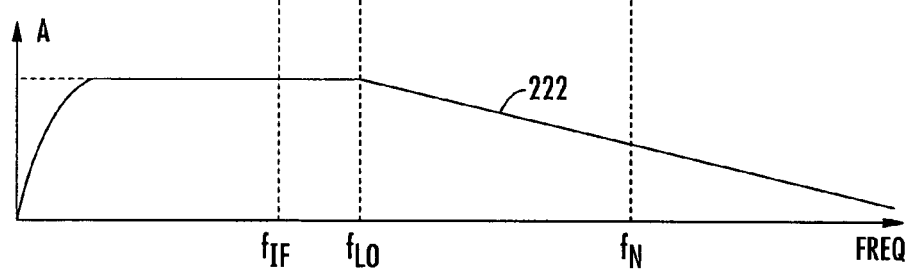
FIG. 2b is an idealized amplitude-frequency plot of the response of a low-pass filter of FIG. 1.
Figure 2C:
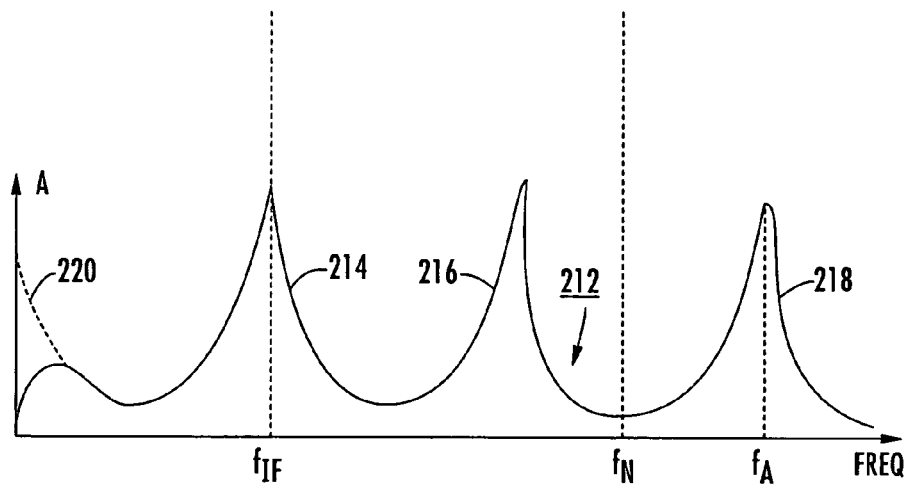
FIG. 2c represents the idealized open-loop gain comb of the regenerative feedback loop of FIG. 1.
Figure 2D:
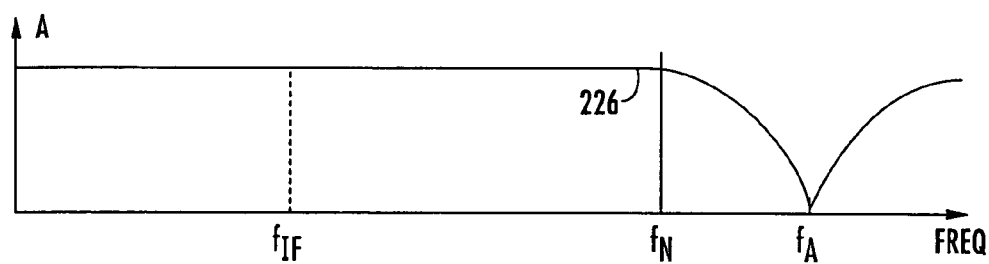
FIG. 2d represents the idealized response of the null filter of FIG. 1.
Figure 2E:
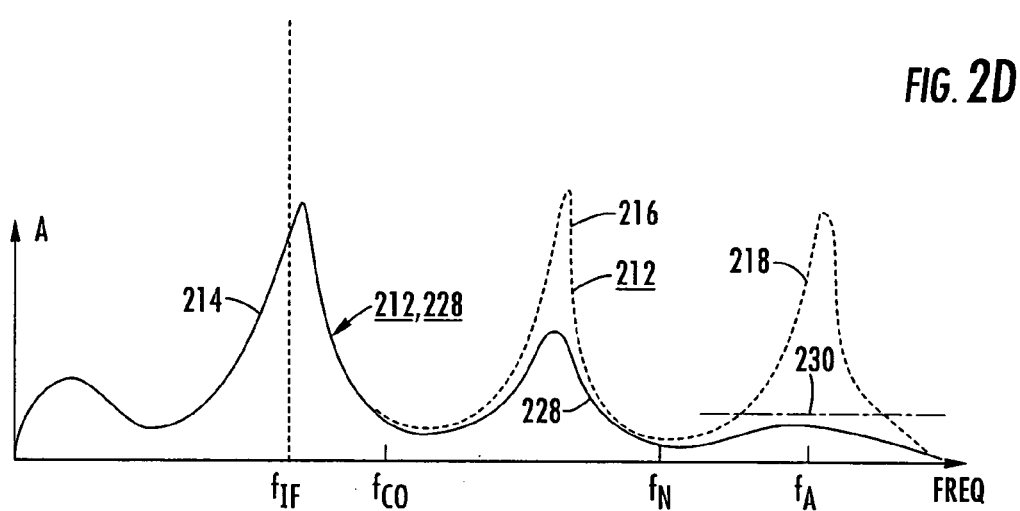
FIG. 2e represents the closed-loop response of the regenerative feedback loop of FIG. 1.
Figure 2F:
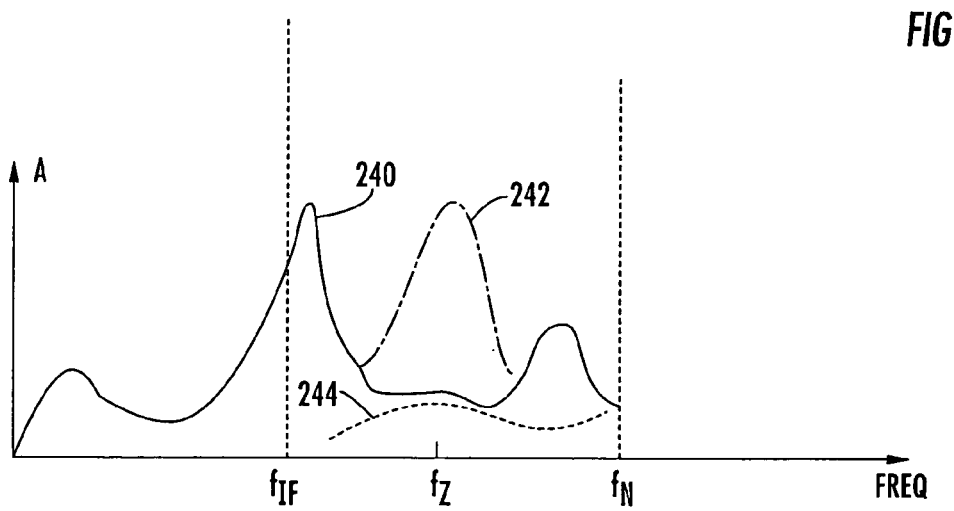
FIG. 2f represents the effective open-loop response of the entire sigma-delta loop.

The invention lies in a sigma-delta converter generally similar to that of U.S. Pat. No. 5,608,400, with a modified topology which provides potentially improved performance. In general, the invention modifies the connection of the regenerative resonator so that the delay of the resonator loop (50 of FIG. 1; 550$_1$, 550$_2$, ... of FIG. 5) is isolated from the delay of the overall sigma-delta feedback loop (48 of FIGS. 1 & 2). This isolation, in turn, reduces the overall or total delay in the main degenerative feedback loop (48 of FIG. 1), which tends to be the largest of the loop delays in comparison to regenerative loops 50 of FIG. 1. The reduce delay in loop 48 of FIG. 1 enables selection of a reduced loop filter transversal delay including that employed in the regenerative resonator feedback loop (corresponding to 50 of FIG. 1).

Figure 7:
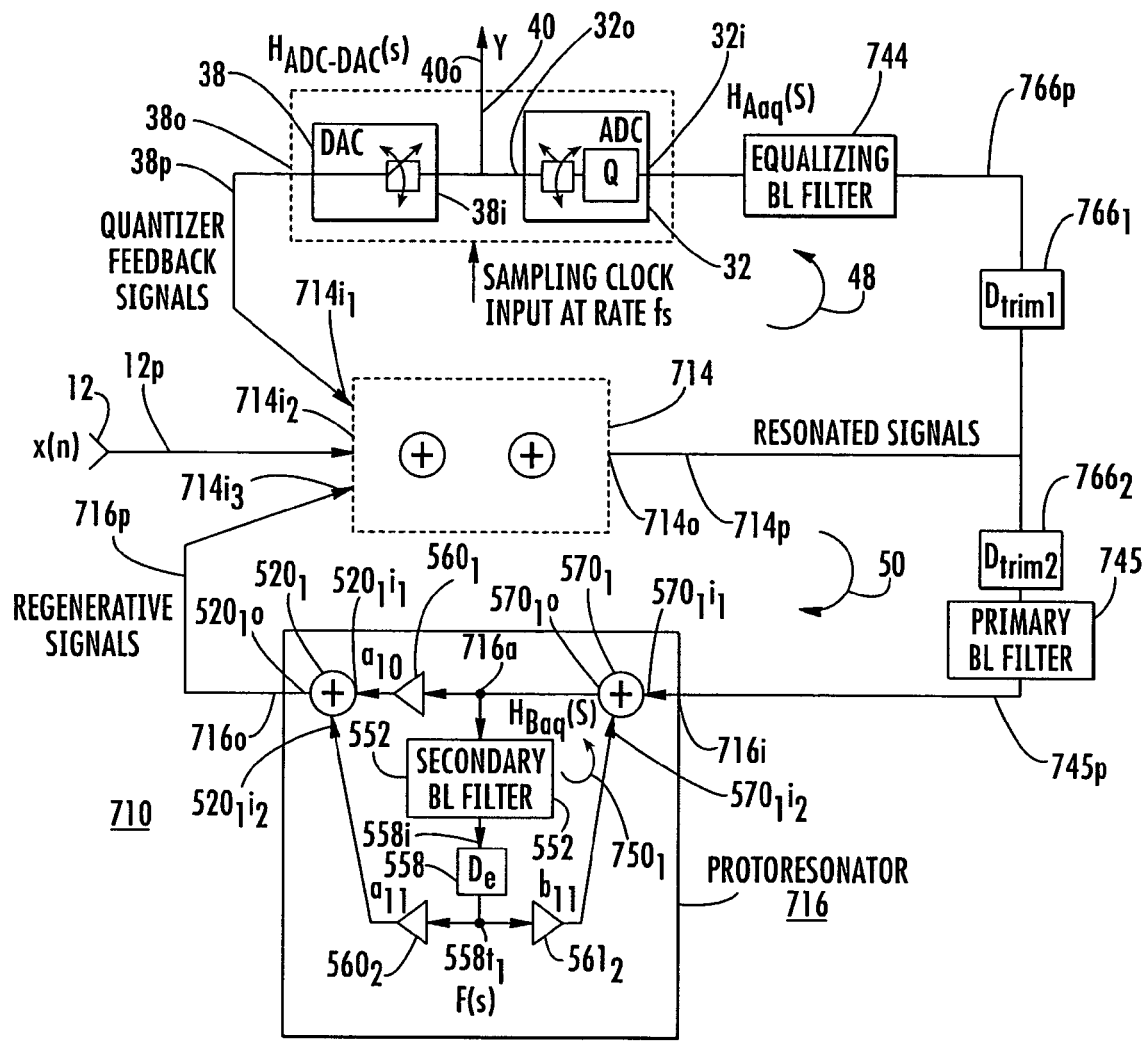

In FIG. 7, an analog-to-digital converter 710 according to an aspect of the invention includes an input port 12 to which band-limited analog signals may be applied. The term "band-limited" in this context suggests that the analog signals are at an IF frequency. The band-limited analog input signals are applied by way of a signal path 12p to an input port 714i$_2$ of a summer or summing circuit 714, which as described below may be a three-input, single-output summing arrangement, or it may be the cascade of two two-input, single-output summing circuits. Summing circuit 714 receives filtered signals at its input port 714i$_3$ from a recursive transversal filter or protoresonator or loop protoresonator filter 716 and an analog reconstruction of the output digital signals from a digital-to-analog converter 38, to produce signals at its output port 714o which are the equivalent of resonated signals described in U.S. Pat. No. 5,608,400. The resonated signals produced by summing circuit 714 at output port 714o are applied by way of a path 714p to a loop sampling and quantizing analog-to-digital converter 32, which produces the desired digital output signals at an output port 40o. It should be noted that both the overall structure 710 of FIG. 7, is an analog-to-digital converter, and a portion of the overall structure 710, namely portion 32, is also an analog-to-digital converter. These should be distinguished by the context in which they are discussed, by the reference numeral, and on occasion by reference to analog-to-digital converter 32 as an analog-to-digital converter "element."

The digital-to-analog converter 38 of FIG. 7 is coupled to output port 40o for receiving the digital output signals from digital-to-analog converter 32, and for converting the digital output signals into the analog reconstruction signals which are applied to input port 714i$_1$ of summing circuit 714. The structure of summing circuit 14 may be viewed as including two summing circuits, the first of which combines the analog reconstruction feedback signal with the input analog signal to produce a difference signal, and a second of which combines the filtered signals from the loop protoresonator filter 16 with the difference signals to generate the resonated difference signals, much as summing circuits 14 and 20 of FIG. 1 together perform the same function. The structure of FIG. 7 separates or isolates the loop delays or latencies of the recursive transversal filter or protoresonator or loop resonator filter 716 from the delays attributable to ADC element 32 and DAC 38. With the two principal delays isolated, the bandwidth of the sigma-delta analog-to-digital converter (E) ADC) is controlled by that one of the delays or latency which is the longer, so the loop bandwidth of the overall analog-to-digital converter 710 may be substantially improved or enlarged by comparison with the arrangement of FIG. 1 or 5, since the sum of two delays A+B is necessarily larger than either A or B alone. In recommended design practice for implementing the invention, the best results are obtained when the latencies of both filtering elements and quantizing elements are nearly equivalent, comprising approximately ½ the latency obtained in the feedback loop in the prior art configurations of FIGS. 1 to 5. Hence, an advantage of approximately a factor of two in loop bandwidth is obtained for the invention described in FIG. 7 over prior art. The latency of known implementations can range from 4 to 3 clock cycles. A means of compensation of this additional delay in the loop filtering to enable stable operation is provided through a resonator employing recursive transversal filter techniques. The use of a protoresonated sum node together with the recursive transversal filter technique can result in 2 to 1 clock cycle delays, but no less than one clock cycle delay.

Figure 5:
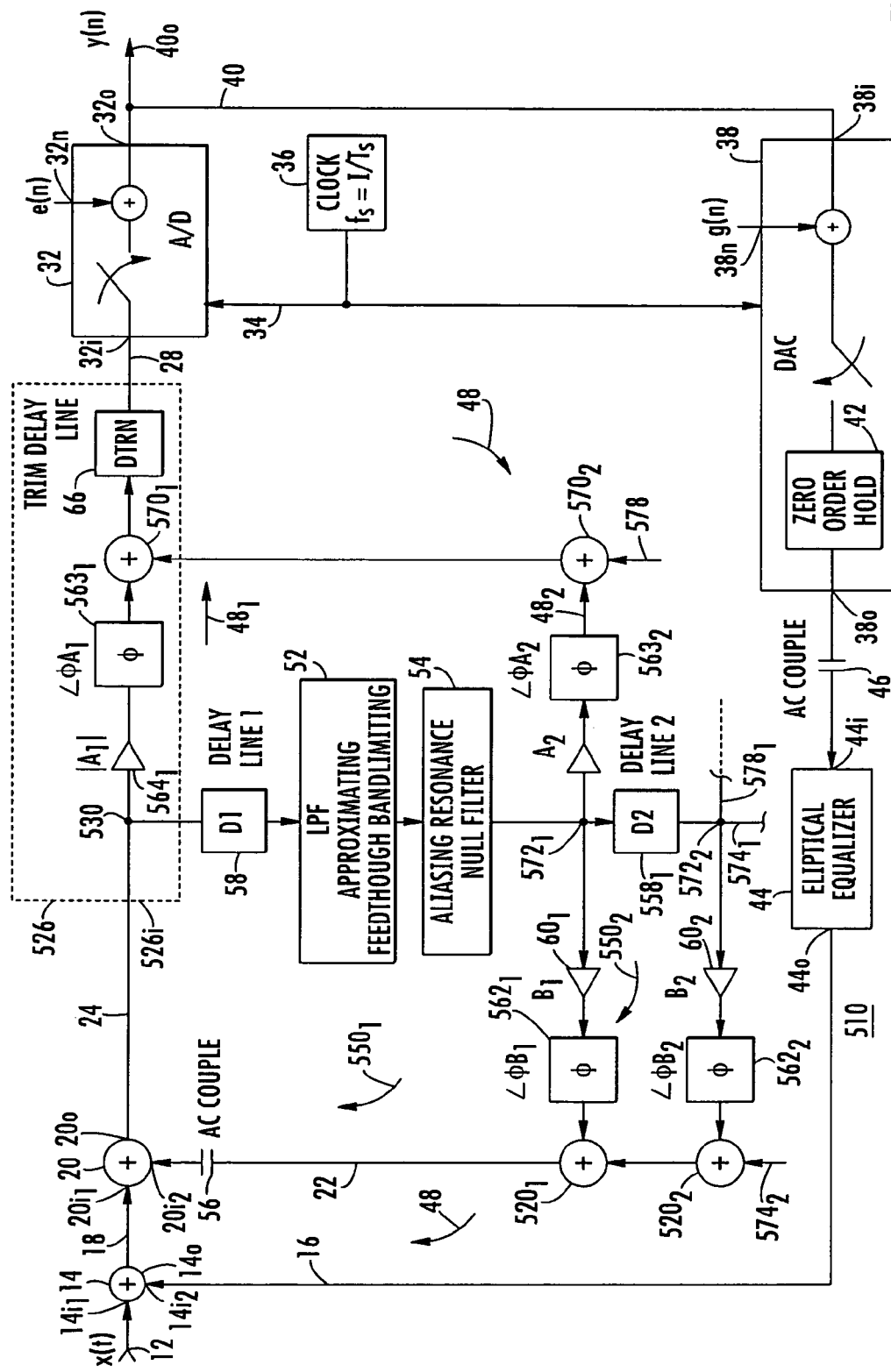
FIG. 5 is a simplified block diagram which illustrates a prior-art sigma-delta analog-to-digital converter with a higher-order resonator than the arrangement of FIG. 1, having multiple resonant and degenerative feedback loops.
Figure 6A:
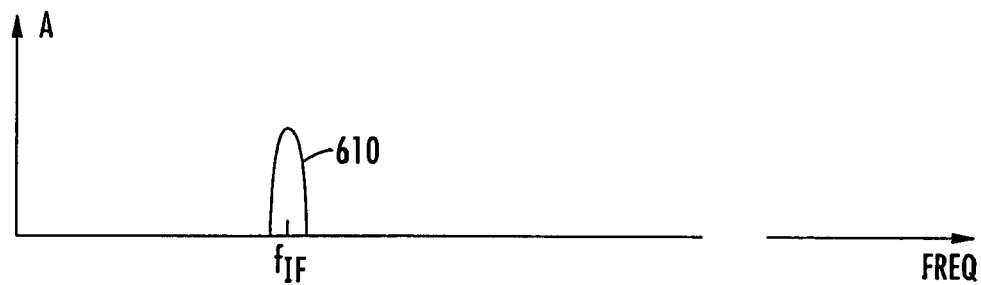
FIG. 6a illustrates a simplified amplitude-frequency spectrum of an analog input signal applied to the ADC of FIG. 5.
Figure 6B:
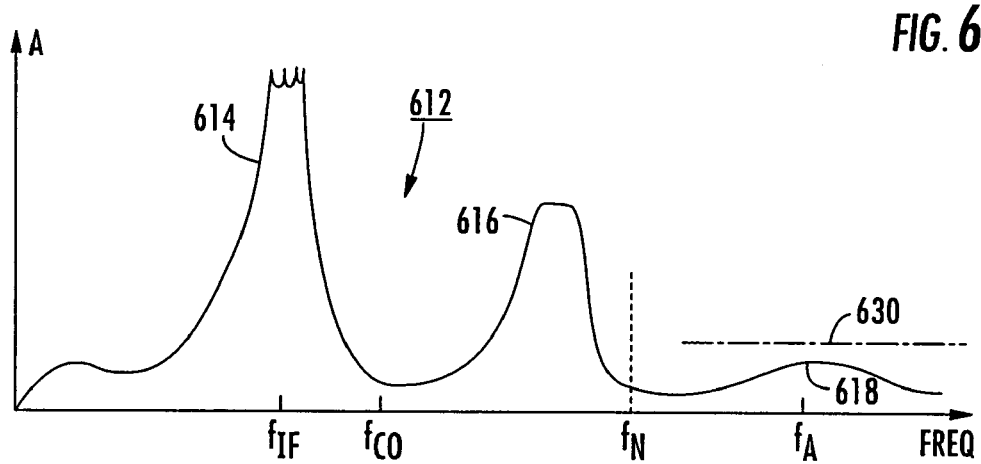
FIG. 6b illustrates the open-loop spectral response 612 of the resonant loops of the arrangement of FIG. 5, as affected by combining the regenerative loop responses with the response of the low-pass filter and the null filter.
Figure 6C:
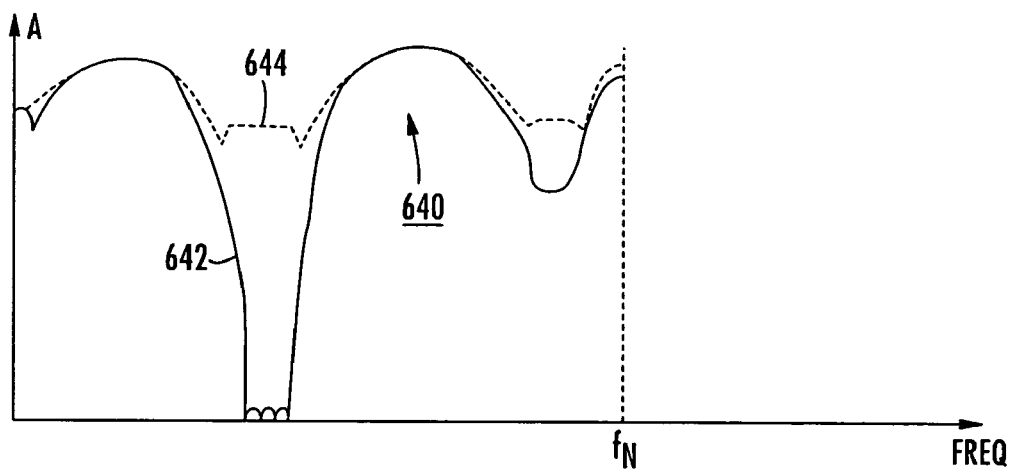
FIG. 6c illustrates the gain of the analog-to-digital converter of FIG. 5, with all the resonant and degenerative feedback loops closed.

Conceptually, the arrangement of analog-to-digital converter 710 of FIG. 7 may be viewed as being the structure of FIG. 5, with a direct signal path extending from the output port 20$o$ of summing circuit 20 to the input port 32$i$ of analog-to-digital converter element 32, and with the signal path 28 between trim delay line 66 and the input port 32$i$ broken and reconnected so as to connect trim delay line 66 to input port 14$i$, or 20$i_1$.

The layout of FIG. 7 is selected to emphasize the isolation which results, as control loops 48 and 50 (or 550) continue to exist, but have no common elements except the linear summing circuit 714. More particularly, loop 48 of FIG. 7 includes summing circuit 714, path 714$p$, trim delay 766$_1$, path 766$p$, equalizing filter 744, analog-to-digital element 32, digital-to-analog converter 38, and path 38$p$ back to the summing circuit 714. Loop 50 includes summing circuit 714, path 714$p$, trim delay 766$_2$, primary bandlimiting filter 745, path 745$p$ coupling signals to input port 716$i$ of recursive transversal filter or protoresonator filter 716, and path 716$p$ from output port 716$o$ of recursive transversal filter or protoresonator 716 to input port 714$i_3$ of summing circuit 714. It should be noted that trim delay 766$_1$ and equalizing filter 744 could be located anywhere in that portion of loop 48 which is not included in loop 50, and similarly delay 766$_2$ and filter 745 could be placed anywhere in that portion of loop 50 which is not included within loop 48.

The delay isolation mentioned above results from the fact that the two loops 48 and 50 are coupled only at the summing circuits, which are linear and provide no significant interaction between the loops other than that prescribed by the summing operations. The noise contributed by the inherent noise generator associated with the input port of analog-to-digital converter element 32 is substantially reduced by the gain notch generated by the action of loop 50, just as described in conjunction with FIGS. 1 and 5.

As illustrated in FIG. 7, recursive transversal filter or protoresonator 716 includes a first summing circuit 570$_1$ having a first input port 570$_1 i_1$ coupled to input port 716$i$ of recursive transversal filter or protoresonator 716, and also having a second input port 570$_1 i_2$ and an output port 570$_1 o$. The output port 570$_1 o$ of first summing circuit 570$_1$ is coupled by way of a node 716$a$ to the input port of an amplifier 560$_1$ and to a block 552 representing an analog low pass bandlimiting filter with cut off frequency less than or equal to the Nyquist frequency, f$_s$/2 that also matches the response of bandlimiting filter 745. The bandlimiting filters 552 and 745 function together to suppress protoresonator gain in path 50 at frequencies greater than the Nyquist frequency, and thereby tend to suppress aliasing effects in the first loop, 48, containing a sampling analog-to-digital converter 32 and a feedback digital-to-analog converter 38, to thereby preserves stable operation of the feedback loops. These filters are designed to substantially match the combined frequency transfer function of the first loop, comprised of the product of transfer functions of the equalizing filter 744, ADC 32, DAC 38, and summing node 714, where magnitude flatness and phase linearity are desirable characteristics in these transfer functions with respect to overall stable operation of the sigma delta analog-to-digital converter.

The output of filter 552 of FIG. 7 is coupled to a further block 558, representing a delay. The delays are set so that the total delay around each loop, accounting for the delay added by components such as amplifiers and interconnects, add to a specified transversal delay value commonly used through out the sigma-delta modulator. The filter structure of FIG. 7 shows a second order modulator where the first delay is contained in the feedback loop path 50, and the second delay, 558, delays the output of the secondary bandlimiting signal. The delay line associated with second order protoresonator filter 716 has only a single delay element, namely delay element 558. The delay line consisting of delay element 558 may be considered to have an input port 558$i$ and a single tap 558$t_1$. The filtered and delayed signals at the output tap 558$t_1$ of block 558 are applied to the input ports of a feedforward path amplifier 560$_2$ and of a feedback path amplifier 561$_2$. The output of feedback amplifier 561$_2$ is applied to the second input port 570$_1 i_2$ of summing circuit 570$_1$. The output of feedforward path amplifier 560$_2$ is applied to the second input port 520$_1 i_2$ of summing circuit 520$_1$. It will be apparent that the structure of the recursive transversal filter or protoresonator 716 of FIG. 7 is virtually identical to a portion the underlying structure of loop 550$_1$ associated with FIG. 5. The gain and phase of the feedforward path and feedback path amplifiers, 560$_2$ and 561$_2$ are programmed or selected in order to obtain a specific sigma-delta noise transfer function. The order of the embodiment of the invention represented by 710 of FIG. 7 can be easily determined to be 2, since the tapped delay line (the delay element 558) is of order one, and is one less than the order of the sigma-delta modulator, given the first delay 766$_2$ in loop 50.

Figure 8:
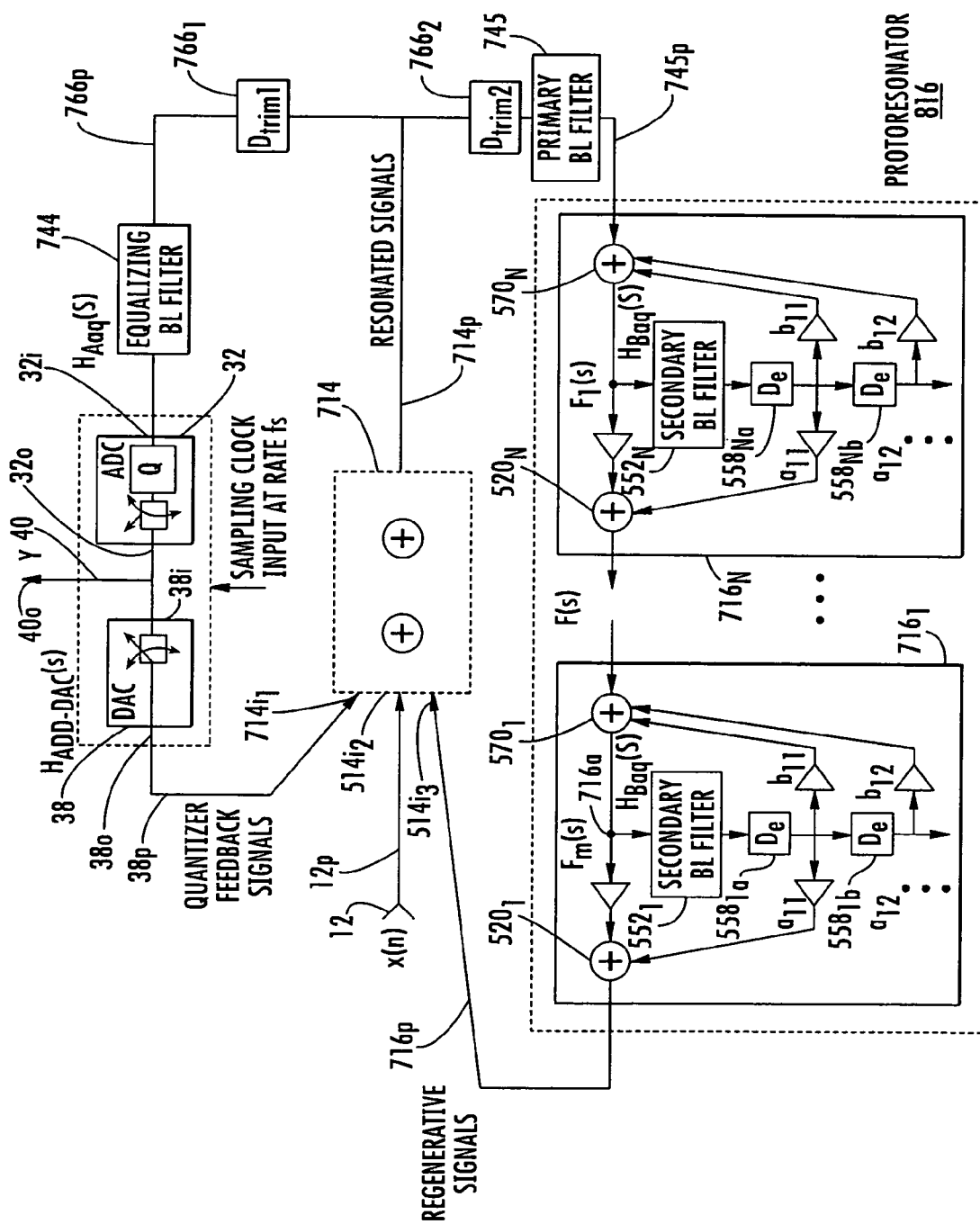
FIG. 8 is a corresponding diagram of a converter having a greater order.

FIG. 8 is a simplified block diagram of another aspect, avatar, manifestation, or embodiment of the invention. Much of FIG. 8 is identical to corresponding portions of FIG. 7, and those portions are identified by like reference numerals. The only salient difference between the arrangement of FIGS. 7 and 8 is that the protoresonator filter, designated 816 in FIG. 8, contains a cascade of a multiplicity of individual elements 716$_1$, . . . , 716$_N$, each of which corresponds to a protoresonator filter 716 of FIG. 7. Also, each element 716$_1$, . . . , 716$_N$ includes a delay line having a plurality of taps greater than 1, so that the order is greater than two.

Figure 9:
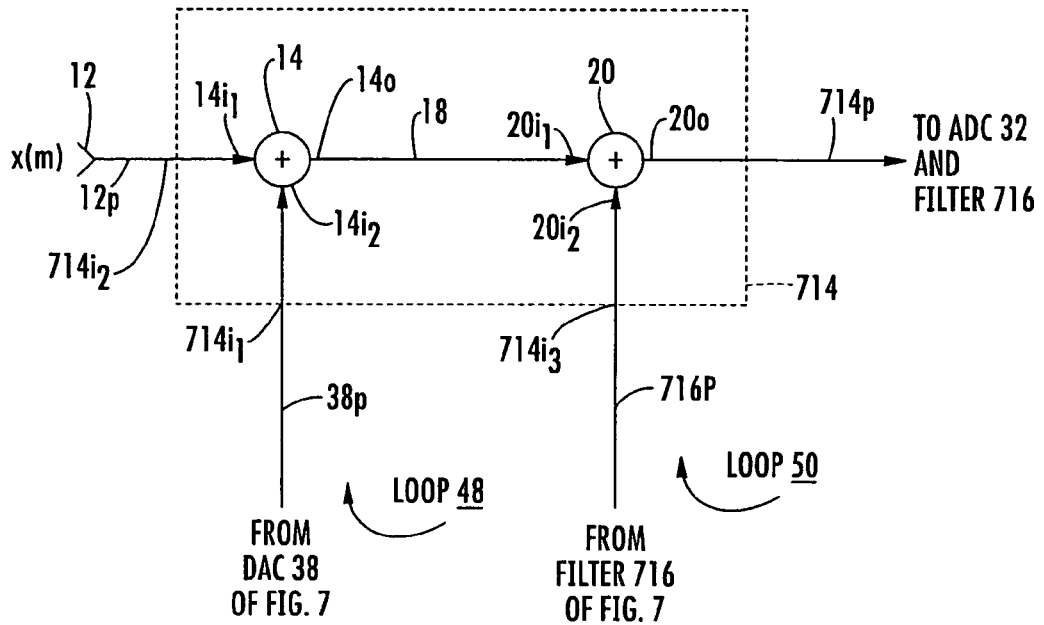
FIG. 9 is a simplified block diagram of a possible summing circuit of FIGS. 7 and 8.

FIG. 9 illustrates some details of a summing circuit of a preferred embodiment of the invention, which may be used in the embodiments of FIG. 7 or 8. In FIG. 9, summing circuit 714 has an input port 14$i_1$, of summing circuit 714 coupled to receive the bandlimited analog input signal x(n) from input port 12, and has its second input port 14$i_2$ coupled to receive the reconstituted analog signal from loop 48 on signal path 38$p$. The resulting difference signal is generated at output port 14$o$, and is applied by way of signal path 18 to the first input port 20$i_1$ of second summing circuit 20. The filtered signal (from protoresonator filter 716 of FIG. 7 or 8) is applied by way of signal path 716$p$ of loop 50 to second input port 20$i_2$. Summing circuit 20 produces at its output port 20$o$, and on signal path 714$p$, the resonated signals required for application to filter 716 and analog-to-digital converter 32.

Figure 10:
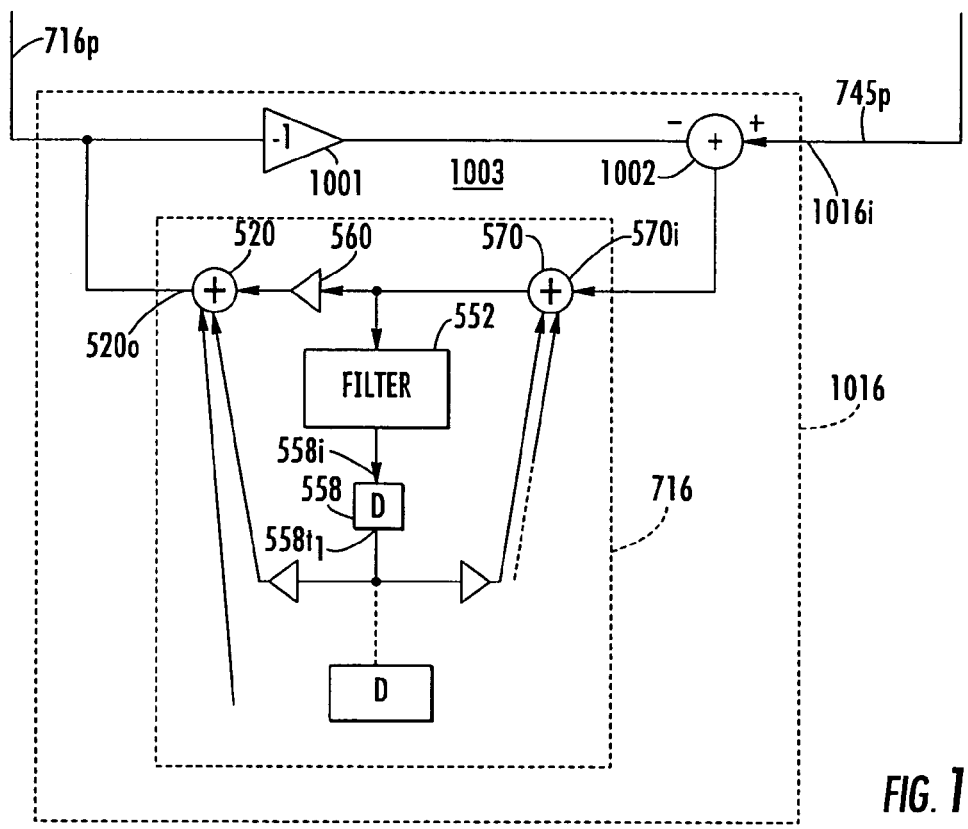
FIG. 10 illustrates details of an alternative form of protoresonator filter section which includes a degenerative feedback path to aid in stabilizing the characteristics of the filter section.

FIG. 10 is a simplified block diagram of a filter section 1016 which may be substituted for recursive transversal filter or protoresonator 716 section 716 of FIG. 7 or for any or all filter section(s) 716$_1$, . . . , 716$_N$ of FIG. 8. In FIG. 10, protoresonator filter 1016 receives resonated signals by way of path 745$p$ at its input port 1016$i$. Within protoresonator filter 1016, the resonated signal is applied to a noninverting input port of a summing circuit 1002, which is part of a leakage degenerative feedback loop designated generally as 1003. The difference signal generated at the output 1002$o$ of summing circuit 1002 is applied to a structure 716, which is identical to a protoresonator filter as illustrated in conjunction with either FIG. 7 or 8. Thus, the difference signals from summing circuit 1002 are applied to the input port 570$i$ of summing circuit 570 of structure 716. The structure 716 of FIG. 10 operates as described in conjunction with FIGS. 1–9, with the filtered output appearing at output port 520o of summing circuit 520 of FIG. 10. A sample of the filtered output signal at port 520o is taken by a tap or transfer element 1001, and applied to the inverting input port (−) of summing circuit 1002, to thereby close a leakage degenerative feedback loop around the recursive transversal filter structure 716. A delay is required in the leakage feedback element, 1001, in order to match the total delay obtained around loop 1003, to the transversal delay employed throughout the sigma-delta modulator. Hence, delay, amplitude adjustment and sign adjustment components are imbedded in the transfer element 1001, as necessary. The leakage degeneration tends to reduce the sensitivity of the filter response to precision error in setting the gain and phase weights in the protoresonator characteristics of the regenerative structure 716 in the arrangement of FIG. 10. This desensitization, in turn, may be used to allow higher stop band attenuation as a result of more stable gain than might be possible in the absence of the degenerative feedback. The specific configuration of FIG. 10 employs a special case when the gain is unity. The weights, or gain and phase values within the recursive transversal filter portion, in addition to the leakage coefficient, are selected to achieve a specified noise shaping characteristic, and are different from prior-art values, due to the inherent differences in the structure. As in prior art sigma-delta modulators, the closed-loop noise transfer function, He(s), defines a transfer function with the desired stop band attenuation, typically ranging from 20 dB to 100 dB in attenuation, corresponding to the pass band, where the signal transfer function, Hx(s), is nearly unity. The function He(s) effectively multiplies the quantization noise spectrum added equivalently at the quantizing ADC node 32, to produce a stop band filtered output quantization noise spectrum, which contains encoded input signals. The basic operation of the continuous-time sigma-delta modulator with sampling and reconstruction is governed by equations (15)

$$H_e(s) = \frac{1}{1 - [R(s)]_p} \cong \frac{1}{1 - R(s)} = \text{Noise Transfer Function} \quad (15)$$

$$H_x(s) = \frac{[R(s)]_p}{1 - [R(s)]_p} \cong \frac{R(s)}{1 - R(s)} = \text{Signal Transfer Function}$$

where the operator [ ]p denotes a periodic Fourier series representation known in prior art, where the multiplicity of path transfer functions incorporate a common bandlimiting function to suppress the effect of aliasing He(s). Hence the approximation, which neglects the effects of the periodic operation, is relatively accurate when this bandlimiting function sufficiently suppresses aliasing effects. The resonating transfer function, R(s), is defined by $$R(s) = \frac{N(s)}{D(s)}, \quad (16)$$

$$N(s) = (A_1(s)e^{-sTe} + A_2(s)e^{-s2Te} + \ldots + A_N(s)e^{-sNTe}),$$

$$D(s) = 1 + B_1(s)e^{-sTe} + B_2(s)e^{-s2Te} + \ldots + B_N(s)e^{-sNTe}$$

The resulting closed loop sigma delta modulator noise transfer function is then given by $$H_e(s) \cong \frac{D(s)}{K(s)} = \frac{D(s)}{D(s) - N(s)} \quad (17)$$

where the closed loop zero function D(s) originates from the pole function of R(s) and the closed loop pole function K(s) originates from the difference between the pole and zero function of R(s). The feedforward path transfer function, or numerator term N(s) contains the necessary lag terms to support a stable rational polynomial, where K(s) can be shown to support the Nyquist Plot stability criterion.

The protoresonator transfer function is defined as producing the transfer function F(s) where $$F(s) = \frac{F_N(s)}{F_D(s)} e^{-sTe} = \frac{\sum_{n=1}^{N} a_{Fn} e^{-s(n-1)Te}}{1 - \sum_{k=1}^{N} b_{Fk} e^{-s(k-1)Te}}. \quad (18)$$

To achieve the desired response the numerator and denominator polynomials are derived from the like polynomials of R(s) according to $$F_D(s) = \frac{N(s)}{A_1}, \quad F_N(s) = e^{sTe}\left(\frac{N(s)}{A_1} - D(s)\right). \quad (19)$$

The variable $A_1$ is the gain portion of the first coefficient of N(s), and therefore, normalizes N(s) so that its zero lag element is unity. This is necessary for causality of $F_D(s)$ and $F_N(s)$. In $F_N(s)$, the zero lag terms cancel, so that the product with the advance (or negative lag) term is causal as well.

The effect of the protoresonating function F(s) implemented by 716 in FIGS. 7 and 816 in FIG. 8 is to produce the resonating transfer function observed across the sum node in the primary degenerative feedback loop 48. The resonating function is given by $$R(s) = \frac{A_1}{1 - F(s)} = \frac{A_1 F_D(s)}{F_D(s) - F_N(s)} \quad (20)$$

In order to attenuate quantization noise, high passband gain is desired in R(s), which results if F(s) approximating unity gain. Therefore, most of the noise shaping gain is generated through the denominator term of R(s) approaching zero.

The coefficients $a_{Fi}$, $b_{Fi}$, of equation 18 can be derived from the resonator transfer function through the following relations.

$$b_{Fi} = -\frac{A_{i+1}}{A_1}, \quad i = 1, 2, \ldots N - 1 \quad (21)$$

$$a_{Fi} = \frac{A_{i+1}}{A_1} + B_i, \quad i = 1, 2, \ldots N - 1$$

The coefficients $A_i$ and $B_i$ are derived from arbitrary discrete time infinite impulse response filters prototype designs, according to prior art means, as described in U.S. Pat. No. 5,608,400.

The inclusion of the degenerative feedback loop 1003, around recursive transversal filter element 716, according to FIG. 10, requires that the total network response implements F(s), and thus, the network elements within recursive transversal filter element 716 must be programmed to implement a function F'(s). Hence, the protoresonating transfer function F(s) is given by $$F(s) = \frac{F'_N(s)e^{-sTe}}{F'_D(s) + F'_N(s)e^{-sTe}}, \quad (22)$$

where $$F'_D(s) = D(s), \; F'_N(s) = e^{sTe}\left(\frac{N(s)}{A_1} - D(s)\right). \quad (23)$$

Observing that $F_N'(s)=F_N(s)$, the only change as a result of the degenerative feedback are the coefficients $b_{Fi}'$ of $F_D'(s)$. These are determined according to $$b_{Fi}^{40} = B_i, \; i=1,2,\ldots N-1 \quad (24)$$

The approach employing the degenerative loop should be noted as produced a more direct means of setting the positions of the noise shaping zeros, and hence, is more easily aligned for desired characteristics. An added benefit is that the precision of the noise shaping zero locations are only affected by the gain and phase in the signal paths implementing coefficients $b_{Fi}$ and the overall gain between 745*p* and 716*p* and are not affected by the other signal path precisions. Also, for those who are skilled in the filter arts, the single stage protoresonator descriptions employed in the preceding argument can be factored into a product of terms where each term represents a cascaded section of the filter. The terms are formed by combining complex conjugate pole pairs and zero pairs and real valued poles and zeros to form real valued weighting filter structures.

Figure 11:
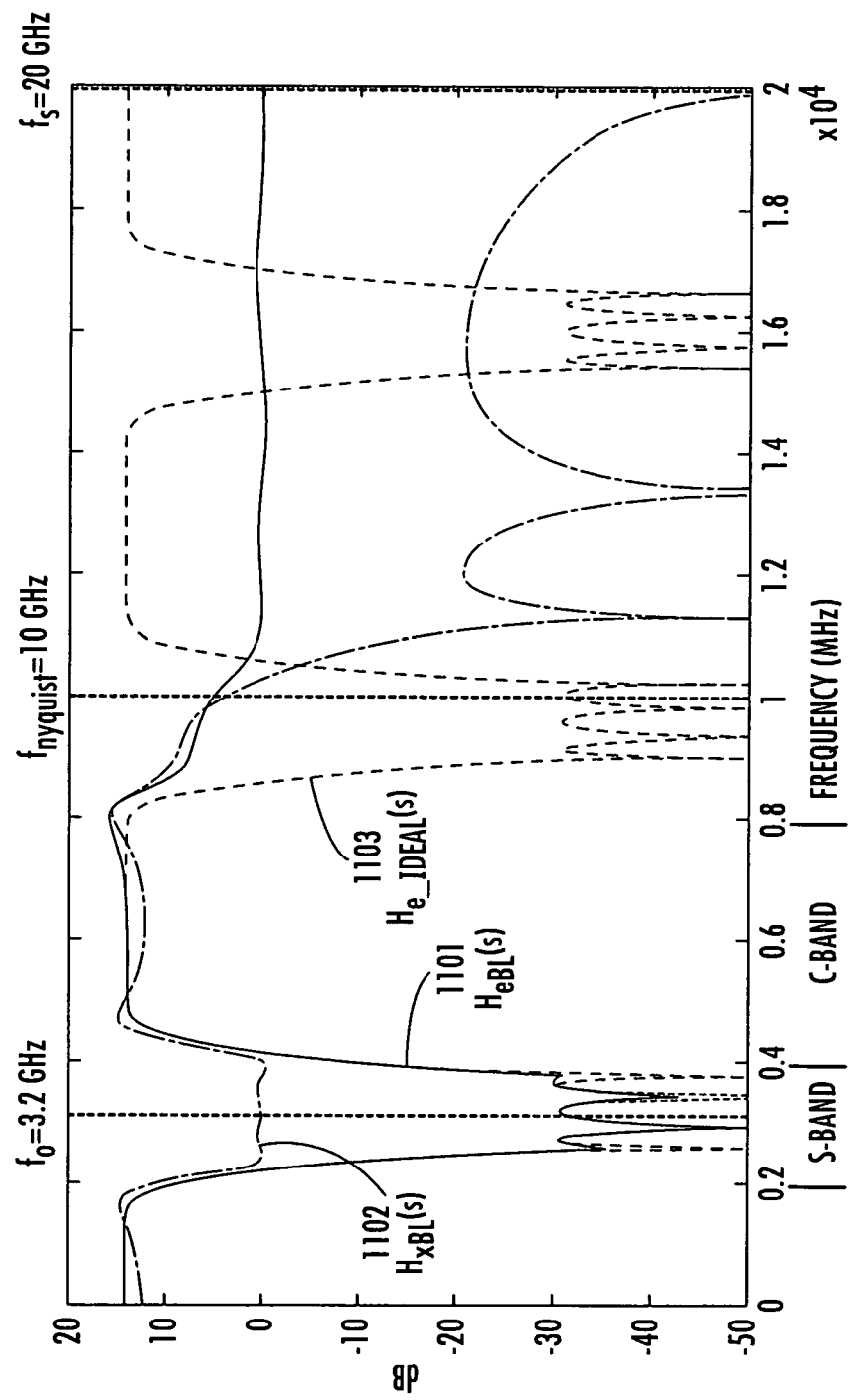
FIG. 11 is a plot of amplitude versus frequency transfer functions relating to embodiments of the invention, where the noise shaping function and signal transfer function are shown.

FIGS. 11, 12, 13 and 14 are plots that illustrate open- and closed-loop responses for one desirable embodiment of the invention, following the configuration of FIG. 7 extended to order 4. This embodiment employs an ADC-DAC quantizing element operated at 20 GHz sampling clock rate at a quantizing resolution of 4 bits, and a fourth order protoresonated sum node loop filter. The weights of the protoresonator are selected to implement a closed loop sigma-delta noise transfer function $H_{eBL}(s)$ with a pass band that is one fifth of periodic frequency, where this periodic frequency is the inverse of the transversal delay. The subscript BL indicates that bandlimiting within the structure has been accounted for. FIG. 11 shows a solid-line plot 1101 representing the signal transfer function, or effective gain of the signal between the analog input port 12*p* and digital output port 40 of FIG. 7 (as modified to order 4), and dot-dash line plot 1102 represents the noise transfer function, or effective gain of noise effectively added at the circuit node between 714*p* and 40, that include the quantizing ADC 32. A signal-to-noise ratio improvement of 33 dB, or 5.5 effective bits, is obtained as a result of the loop filter attenuation over a 1.28 GHz bandwidth centered at 3.2 GHz. This can easily represent an entire operational band of an RF receiving system. The quantizing ADC at 4 effective bits of resolution and operating at 20 GHz clock rate produces an input additive whitened noise term that is determined by the effective bits of quantizer×6.02+1.76, which is nominally 25.8 dB. This noise is uniformly spread over the Nyquist bandwidth of 10 GHz. The noise present in the pass band is reduced by the factor $10 \times log_{10}(1.28 \text{ GHz}/10 \text{ GHz})=8.9$ dB, where 1.5 effective additional bits of resolution is gained. The resulting converter directly samples an entire operation band with 5.5+4+1.5=11 effective number of bits. This represents a noise density of −159 dBFS/Hz. Here, dBFS/Hz represents the dB value of the noise below the full scale amplitude level of the ADC observed in a 1 Hz noise bandwidth. The design can be modified with a higher order loop filter, such as order 6, to enable 11.6 effective number of bits and a noise density of −169 dBFS/Hz. For a converter of this relatively wide bandwidth and high input frequency, this represents a significantly higher performance level than prior art wide band ADCs.

The transversal delay in the above example is 156.25 picoseconds long, which requires a minimum latency equivalent to 3.125 clock cycles. A delay greater than the ideal single clock cycle delay is necessary to account for ADC input and DAC output stages, in addition to loop filter components. All the components and interconnects in path 48 of FIG. 7 contribute to latency which makes the low latency requirement of the particular latency difficult to achieve with prior art at the high clock rate of the example. This is particularly critical when each stage and the bandlimiting filter element contribute a significant portion of the prescribed latency. The invention provides a means of realizing this latency through a single stage sum node operation equivalent to that of a single amplifier. The simplified sum node diagram of FIG. 9, with the inputs 12*p*, 38*p* and 716*p* shows the use of two stages, but can be reduced to a single stage employing a parallel current summing amplifier arrangement, which can be realized with a current summing differential amplifier.

FIG. 11 shows the realized bandlimited noise transfer function in plot 1101 observed with the effect associated with the bandlimiting filters included. For illustration, the plot 1103 shows the periodic transfer function that would develop given not bandlimiting or aliasing in the feedback loop. Plot 1102 shows the signal transfer function obtained. The ratio between the signal transfer gain in the pass band and the noise transfer function gain in the same pass band represents the improvement in signal to noise ratio obtained as a result of closed loop sigma-delta modulation.

Figure 12:
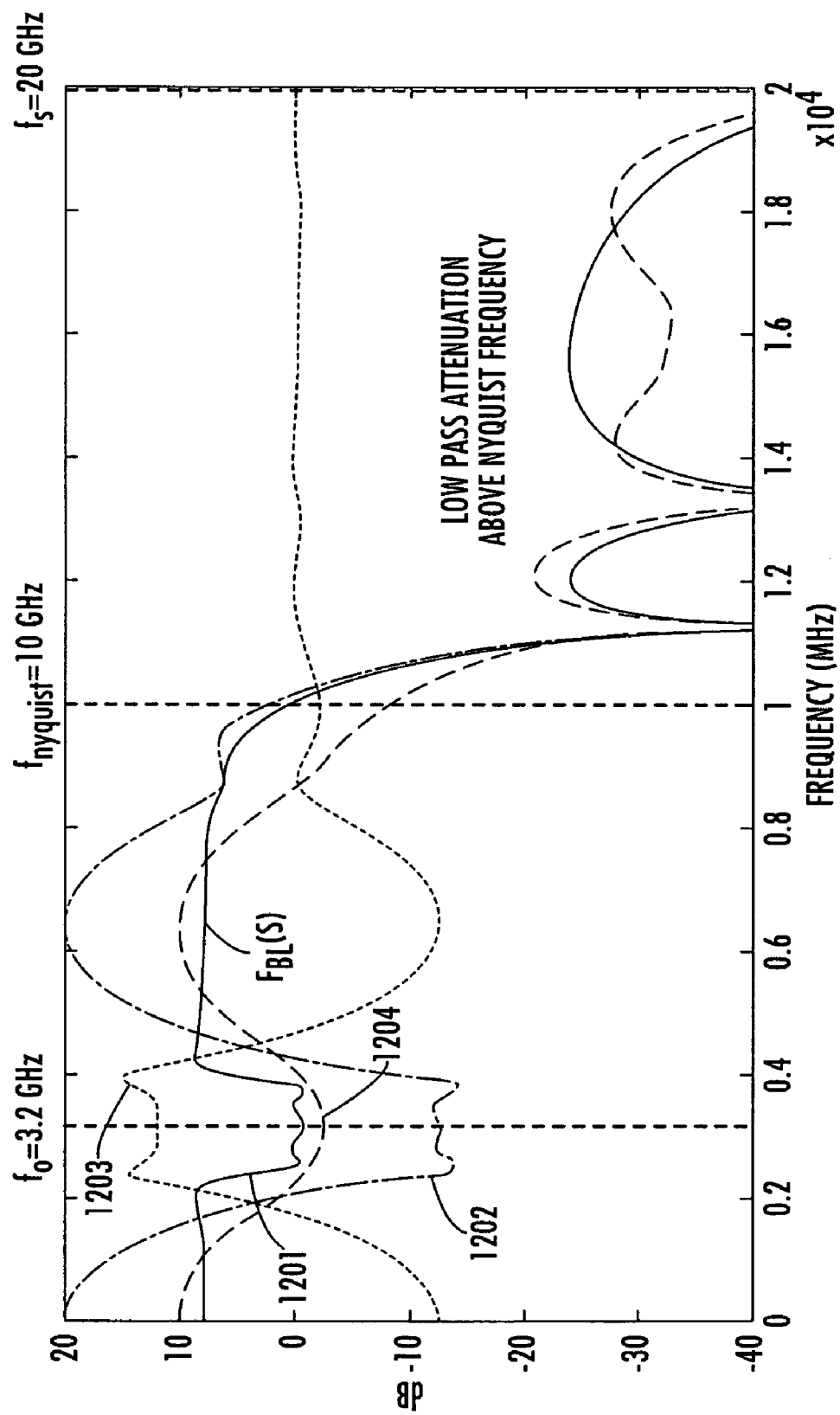
FIG. 12 is a plot of amplitude versus frequency transfer functions that shows response of the protoresonator open loop filter response on constituent transfer functions.
Figure 13:
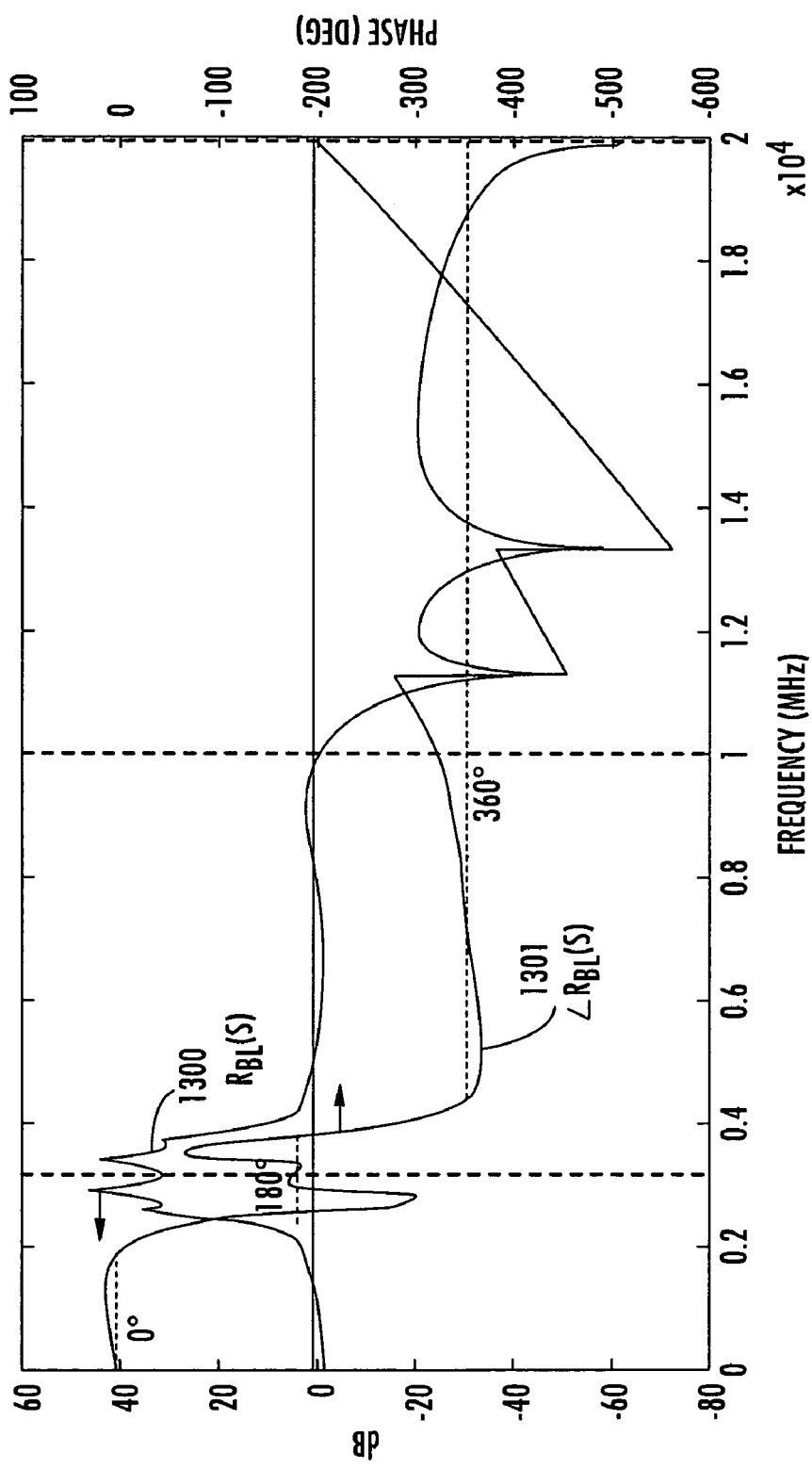
FIG. 13 contains plots of both the amplitude and phase versus frequency transfer functions relating to the resulting resonator loop filter formed by the protoresonator filter related to the plots of FIGS. 11 through 12.

FIG. 12 shows the amplitude, in Decibels, of various protoresonator transfer functions. In FIG. 12, the Plot 1201 represents the open loop bandlimited protoresonator transfer $F_{BL}(s)$ and its factored numerator term 1202, which is $F_{NBL}(s)$, and the inverse denominator term 1203 which is $1/F_{BL}(s)$. The plot 1204 shows $F_{BL}(s)-1$, the primary constituent of the denominator term containing bandlimiting filters. The plot 1201 is obtained by the product of transfer functions represented by 1202 and 1203. The plots 1202 and 1204 show the bandlimiting of each of the filters 766 and 552 in FIG. 7, and its effect on bandlimiting $F_{BL}(s)$ to suppress protoresonator response above the Nyquist frequency, which is 10 GHz. FIG. 13 shows the open loop response, where the plot 1300 is the amplitude response, and the plot 1301 is the phase response, observed in primary feedback loop path 48 in FIG. 7 accounting for all component frequency responses. The response shown is that of a resonating transfer function with feedback gain and phase response that provides suppression of quantization within the pass band and stability outside the pass band. It should be noted that all delay terms are included in this plot.

Figure 14:
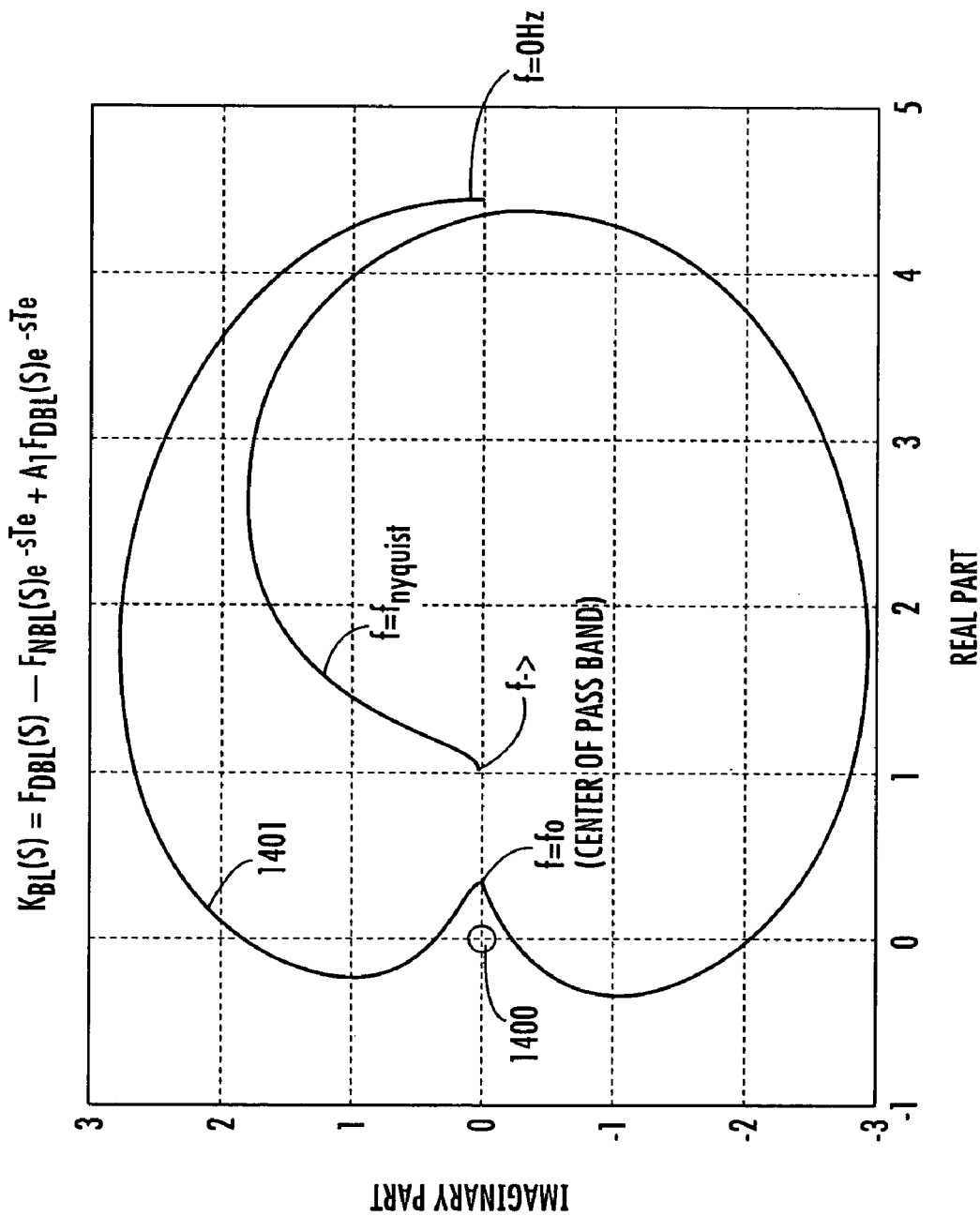
FIG. 14 is a plot in the complex plane as a function of frequency relating to an embodiment of the invention, where the plot is employed in establishing linear feedback stability of the sigma-delta modulator

FIG. 14 shows a graphical analysis of the function $K_{BL}(s)$ that determines whether the sigma-delta feedback loop is stable. The function $K_{BL}(s)$ is given by $$K_{BL}(s) = F_{DBL}(s) - F_{NBL}(s)e^{-sTe} + A_1 F_{DBL}(s)e^{-sTe} \quad (25)$$

Plot 1401 of FIG. 14 represents the closed-loop denominator function $K(s=j2\pi f)$ where the bandlimiting occurring within the sigma-delta modulator has been accounted for. This is a mixed polynomial of factors $e^{-snte}$ and $s^n$ and has an infinite number of roots. An effective means of determining stability is to plot the real part of $K_{BL}(s)$ versus the imaginary part of $K_{BL}(s)$ in the manner shown in FIG. 14, and to ensure that the function does not pass through or encircle the origin 1400. This is a form of the Nyquist stability criterion, used in analysis of control systems with significant transport delay. In FIG. 14, the origin 1400 is not encircled by the complex plot of $K_{BL}(s)$ 1401, over all frequencies. Hence the continuous-time sigma-delta modulator example is shown to support stable closed-loop operation for cases in which the Nyquist frequency is equal to or exceeds that in the example.

Other embodiments of the invention will be apparent to those skilled in the art. For example, while operation at IF has been described, the sigma-delta ADC may be operated at baseband. While in the arrangements of FIGS. 7 and 8 no elements are shown as being included in the common path of both loops 48 and 50 except the summing circuit 714, it is possible to employ multiple cascaded sum node or to combine recursive transversal filter sections with protoresonated sum node segments, but these modified configurations will not reduce latency as that one employing a single protoresonated sum node.

Thus, according to a first aspect of the invention, a sigma-delta analog-to-digital converter (710), which may operate with either single or multiple bits, converts band-limited analog signals (applied to port 12) into corresponding digital signals (at port 40o) in either a single-bit or a parallel-bit context. The analog-to-digital converter (710) comprises a loop sampling and quantization analog-to-digital converter element (32) including an input port (32i), and an output port (32o) at which output digital signals are generated in response to resonated difference signals applied to the input port (32i). The sigma-delta analog-to-digital converter (710) also includes a loop digital-to-analog converter (38) including an input port (38i) coupled to the output port (32o) of the loop analog-to-digital converter element (32), for generating an analog reconstruction of the output digital signals. An input summing arrangement (714) includes a first input port ($714i_2$) coupled for receiving the band-limited analog signal and an output port (714o) coupled (by path 714p, delay $766_1$, path 766p, and filter 744) to the input port (32i) of the loop sampling and quantization analog-to-digital converter element (32), for summing the band-limited analog signal with the analog reconstruction of the output digital signals and with filtered signals, to form the resonated difference signals. The input summing arrangement is linear. The loop sampling and quantization analog-to-digital converter element (32), the loop digital-to-analog converter (38), and the input summing arrangement (714) are coupled in a first loop (48) having a first loop delay. The sigma-delta analog-to-digital converter (710) also includes an analog "protoresonator" filter (716) including a single input port (716i), or at least one input port coupled to receive the resonated difference signals, and also including an output port (716o) at which the filtered signals are generated. The output port (716o) of the protoresonator is coupled to a second input port ($714i_3$) of the summing arrangement (714), to form a second loop (50) including the analog protoresonator filter (716) and the input summing arrangement (714). The second loop (50) is regenerative and has order greater than one, where order is the number of weighted transversal delays, corresponding to the number of taps (counting the input port as a tap) on the delay line associated therewith.

In a particular avatar of this aspect of the invention, a sigma-delta analog-to-digital converter (710) input summing arrangement (714) comprises a first summing circuit (14) including a first input port ($14i_1$) coupled to receive the band-limited analog signal and a second input port ($14i_2$) coupled to receive one of the filtered signals and the analog reconstruction of the digital output signals, for summing the one of the filtered signals and the analog reconstruction of the digital output signals with the band-limited analog signal, to thereby generate (on path 18) an intermediate signal. The input summing arrangement (714) also includes a second summing circuit (20) including a first input port ($20i_1$) coupled to receive the intermediate signal and a second input port ($20i_2$) coupled to receive the other one of the filtered signals and the analog reconstruction of the digital output signals, for summing the intermediate signals with the other one of the filtered signals and the analog reconstruction of the digital output signals, to thereby generate the resonated difference signals. In one version, the one of the filtered signals and the analog reconstruction of the digital output signals is the analog reconstruction of the digital output signals, and the other one is the filtered signals.

In another manifestation of the aspect of the invention, the loop sampling and quantization analog-to-digital converter element (32), the loop digital-to-analog converter (38), and the first summing circuit (714) are located within a first loop (48), and the first summing circuit (714) and the protoresonator filter 716) are located within a second loop (50), whereby the first summing circuit (714) is a common element within the first (48) and second (50) loops. The sigma-delta analog-to-digital converter (710) further comprises a delay ($766_1$, $766_2$) coupled in one of the first (48) and second (50) loops for tending to equalize the delay around the first and second loops for stabilizing the sigma-delta analog-to-digital converter (710).

What is claimed is:

1. A sigma-delta analog-to-digital converter for converting band-limited analog signals into corresponding digital signals, said analog-to-digital converter comprising:
  a loop sampling and quantization analog-to-digital converter including an input port, and an output port at which output digital signals are generated in response to resonated difference signals applied to said input port;
  a loop digital-to-analog converter including an input port coupled to said output port of said loop analog-to-digital converter, for generating an analog reconstruction of said output digital signals;
  an input summing arrangement including an input port coupled for receiving said band-limited analog signal and an output port coupled to said input port of said loop sampling and quantization analog-to-digital converter, for summing said band-limited analog signals with said analog reconstruction of said output digital signals and with filtered signals, to form said resonated difference signals, said loop sampling and quantization analog-to-digital converter, said loop digital-to-analog converter, and said input summing arrangement being coupled in a first loop having a first delay; and an analog filter including a single input port coupled to receive said resonated difference signals, and also including an output port at which said filtered signals are generated, which output port of said analog filter is coupled to said input summing arrangement to form a second loop including said analog filter and said input summing arrangement, which second loop is regenerative and has order greater than one, where order is the number of weighted transversal delays.

2. An analog-to-digital converter according to claim 1, wherein said input summing arrangement comprises:
   a first summing circuit including a first input port coupled to receive said band-limited analog signal and a second input port coupled to receive one of said filtered signals and said analog reconstruction of said digital output signals, for summing said one of said filtered signals and said analog reconstruction of said digital output signals with said band-limited analog signals, to thereby generate an intermediate signal; and
   a second summing circuit including a first input port coupled to receive said intermediate signal and a second input port coupled to receive the other one of said filtered signals and said analog reconstruction of said digital output signals, for summing said intermediate signals with said other one of said filtered signals and said analog reconstruction of said digital output signals, to thereby generate said resonated difference signals.

3. An analog-to-digital converter according to claim 2, wherein said one of said filtered signals and said analog reconstruction of said digital output signals is said analog reconstruction of said digital output signals, and said other one is said filtered signals.

4. An analog-to-digital converter according to claim 1, wherein said loop sampling and quantization analog-to-digital converter, said loop digital-to-analog converter, and said first summing circuit are located within a first loop, and said first summing circuit and said analog filter are located within a second loop, whereby said first summing circuit is a common element within said first and second loops, said analog-to-digital converter further comprising:
   delay means coupled in one of said first and second loops for tending to equalize the delay around said first and second loops for stabilizing said analog-to-digital converter.

5. A sigma-delta analog-to-digital converter for converting band-limited analog signals into corresponding digital signals, said analog-to-digital converter comprising:
   a loop sampling and quantization analog-to-digital converter including an input port, and an output port at which output digital signals are generated in response to resonated difference signals applied to said input port;
   a loop digital-to-analog converter including an input port coupled to said output port of said loop analog-to-digital converter, for generating an analog reconstruction of said output digital signals;
   an input summing arrangement including an input port coupled for receiving said band-limited analog signals and an output port coupled to said input port of said loop sampling and quantization analog-to-digital converter, for summing said band-limited analog signal with said analog reconstruction of said output digital signals and with filtered signals, to form said resonated difference signals, said loop sampling and quantization analog-to-digital converter, said loop digital-to-analog converter, and said input summing arrangement being coupled in a first loop having a first delay; and
   an analog filter including an input port coupled to said output port of said input summing arrangement to receive said resonated difference signals, and also including an output port at which said filtered signals are generated, which output port of said analog filter is coupled to said input port of said input summing arrangement to form a second loop including said analog filter and said input summing arrangement, said first and second loops having only linear elements in common.

6. A sigma-delta analog-to-digital converter according to claim 5, wherein said input port of said analog filter is the sole input port of said analog filter.

7. A sigma-delta analog-to-digital converter for converting band-limited analog signals into corresponding digital signals, said analog-to-digital converter comprising:
   a loop sampling and quantization analog-to-digital converter including an input port, and an output port at which output digital signals are generated in response to resonated difference signals applied to said input port;
   a loop digital-to-analog converter including an input port coupled to said output port of said loop analog-to-digital converter, for generating an analog reconstruction of said output digital signals;
   an input summing arrangement including an input port coupled for receiving said band-limited analog signals and an output port coupled to said input port of said loop sampling and quantization analog-to-digital converter, for summing said band-limited analog signal with said analog reconstruction of said output digital signals and with filtered signals, to form said resonated difference signals, said loop sampling and quantization analog-to-digital converter, said loop digital-to-analog converter, and said input summing arrangement being coupled in a first loop having a first delay; and
   an analog filter including an input port coupled to said output port of said input summing arrangement to receive said resonated difference signals, and also including an output port at which said filtered signals are generated, which output port of said analog filter is coupled to said input port of said input summing arrangement to form a second loop including said analog filter and said input summing arrangement, said first and second loops having only said input summing arrangement in common.

8. A sigma-delta analog-to-digital converter according to claim 7, wherein said input port of said analog filter is the sole input port of said analog protoresonator filter.

* * * * *